US010982141B2

(12) United States Patent
Moon et al.

(10) Patent No.: US 10,982,141 B2
(45) Date of Patent: Apr. 20, 2021

(54) PHOSPHOR COMPOSITION, LIGHT-EMITTING DEVICE PACKAGE COMPRISING SAME, AND LIGHTING APPARATUS

(71) Applicant: LG INNOTEK CO., LTD., Seoul (KR)

(72) Inventors: Ji Wook Moon, Seoul (KR); Jin Sung Kim, Seoul (KR); Woo Seuk Song, Seoul (KR); Seung Jae Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 371 days.

(21) Appl. No.: 16/065,433

(22) PCT Filed: Dec. 22, 2016

(86) PCT No.: PCT/KR2016/015097
§ 371 (c)(1),
(2) Date: Jun. 22, 2018

(87) PCT Pub. No.: WO2017/111495
PCT Pub. Date: Jun. 29, 2017

(65) Prior Publication Data
US 2019/0016954 A1    Jan. 17, 2019

(30) Foreign Application Priority Data
Dec. 23, 2015  (KR) .................. 10-2015-0184754

(51) Int. Cl.
*C09K 11/77*  (2006.01)
*C09K 11/70*  (2006.01)
(Continued)

(52) U.S. Cl.
CPC .......... *C09K 11/70* (2013.01); *C09K 11/0883* (2013.01); *C09K 11/7734* (2013.01);
(Continued)

(58) Field of Classification Search
CPC .......... C09K 11/7734; C09K 11/77342; C09K 11/77344; C09K 11/77346; C09K 11/77347; C09K 11/77348
See application file for complete search history.

(56) References Cited

U.S. PATENT DOCUMENTS 6,621,211 B1 * 9/2003 Srivastava ............ H01L 33/504
                                                    313/503
10,008,641 B2   6/2018 Moon et al.
(Continued)

FOREIGN PATENT DOCUMENTS

CN    103710026 A    10/2003
CN    101379163 A    2/2007
(Continued)

OTHER PUBLICATIONS

International Search Report (with English Translation) and Written Opinion dated Apr. 11, 2017 issued in Application No. PCT/KR2016/015097.

(Continued)

Primary Examiner — Matthew E. Hoban
(74) Attorney, Agent, or Firm — KED & Associates LLP

(57) ABSTRACT

An embodiment relates to a phosphor composition, a light-emitting device package comprising the same, and a lighting apparatus and, more particularly, to a phosphor composition comprising a first phosphor, excited by an excitation light source, for emitting a first wavelength range of light, a second phosphor, excited by the excitation light source, for emitting a second wavelength range of light, and a third phosphor, excited by the excitation light source, for emitting a third wavelength range of light. The light emitted from the phosphor composition exhibits an increased intensity of light in a blue-green wavelength region with the consequent improvement of color rendering index and a shortened (Continued)

wavelength of light in a red wavelength region with the consequent improvement of luminous flux.

10 Claims, 23 Drawing Sheets

(51) Int. Cl.
    *C09K 11/08*     (2006.01)
    *F21K 9/64*     (2016.01)
    *F21S 2/00*     (2016.01)
    *H01L 33/62*     (2010.01)
    *H01L 33/50*     (2010.01)
    *F21Y 115/10*     (2016.01)

(52) U.S. Cl.
    CPC ............ *C09K 11/7774* (2013.01); *F21K 9/64* (2016.08); *F21S 2/005* (2013.01); *H01L 33/62* (2013.01); *F21Y 2115/10* (2016.08); *H01L 33/502* (2013.01); *H01L 33/504* (2013.01); *H01L 2224/48091* (2013.01); *H01L 2924/181* (2013.01); *Y02B 20/00* (2013.01)

(56) References Cited

U.S. PATENT DOCUMENTS

| | | | |
|---|---|---|---|
| 2009/0033201 A1* | 2/2009 | Shimooka | C09K 11/7734 313/483 |
| 2009/0166584 A1 | 7/2009 | Shimooka et al. | |
| 2009/0322990 A1* | 12/2009 | Kawana | G02B 6/0073 349/68 |
| 2010/0084962 A1 | 4/2010 | Winkler et al. | |
| 2010/0142189 A1* | 6/2010 | Hong | C09K 11/0883 362/97.3 |
| 2011/0163322 A1* | 7/2011 | Yoo | C09K 11/0883 257/76 |
| 2011/0180780 A1* | 7/2011 | Yoo | C09K 11/7734 257/13 |
| 2012/0212123 A1 | 8/2012 | Sakuta et al. | |
| 2012/0228550 A1 | 9/2012 | Won et al. | |
| 2013/0207535 A1 | 8/2013 | Hirosaki et al. | |
| 2013/0249422 A1* | 9/2013 | Kerstens | H05B 45/37 315/193 |
| 2014/0097744 A1 | 4/2014 | Kubota et al. | |
| 2014/0168943 A1 | 6/2014 | Peeters et al. | |
| 2014/0339584 A1 | 11/2014 | Kim et al. | |
| 2015/0014725 A1 | 1/2015 | Hong et al. | |
| 2015/0048399 A1 | 2/2015 | Weiler et al. | |
| 2015/0070875 A1 | 3/2015 | Hirosaki et al. | |
| 2015/0377429 A1* | 12/2015 | Yoo | C09K 11/7739 313/503 |
| 2017/0047488 A1* | 2/2017 | Kaneko | H01L 33/62 |

FOREIGN PATENT DOCUMENTS

| | | |
|---|---|---|
| CN | 102686700 A | 2/2011 |
| CN | 104024377 A | 11/2012 |
| CN | 104114671 A | 2/2013 |
| CN | 104024375 A | 5/2013 |
| CN | 103820118 A | 11/2013 |
| CN | 104164234 A | 5/2014 |
| CN | 104282828 A | 7/2014 |
| CN | 104263359 A | 9/2014 |
| JP | 2013-047349 | 3/2013 |
| KR | 10-2010-0015388 | 2/2010 |
| KR | 10-0984273 | 10/2010 |
| KR | 10-2015-0055598 | 5/2015 |
| WO | WO2015166782 * | 4/2014 |

OTHER PUBLICATIONS

Chinese Office Action dated Nov. 11, 2020 issued in Application 201680076204.0.

* cited by examiner

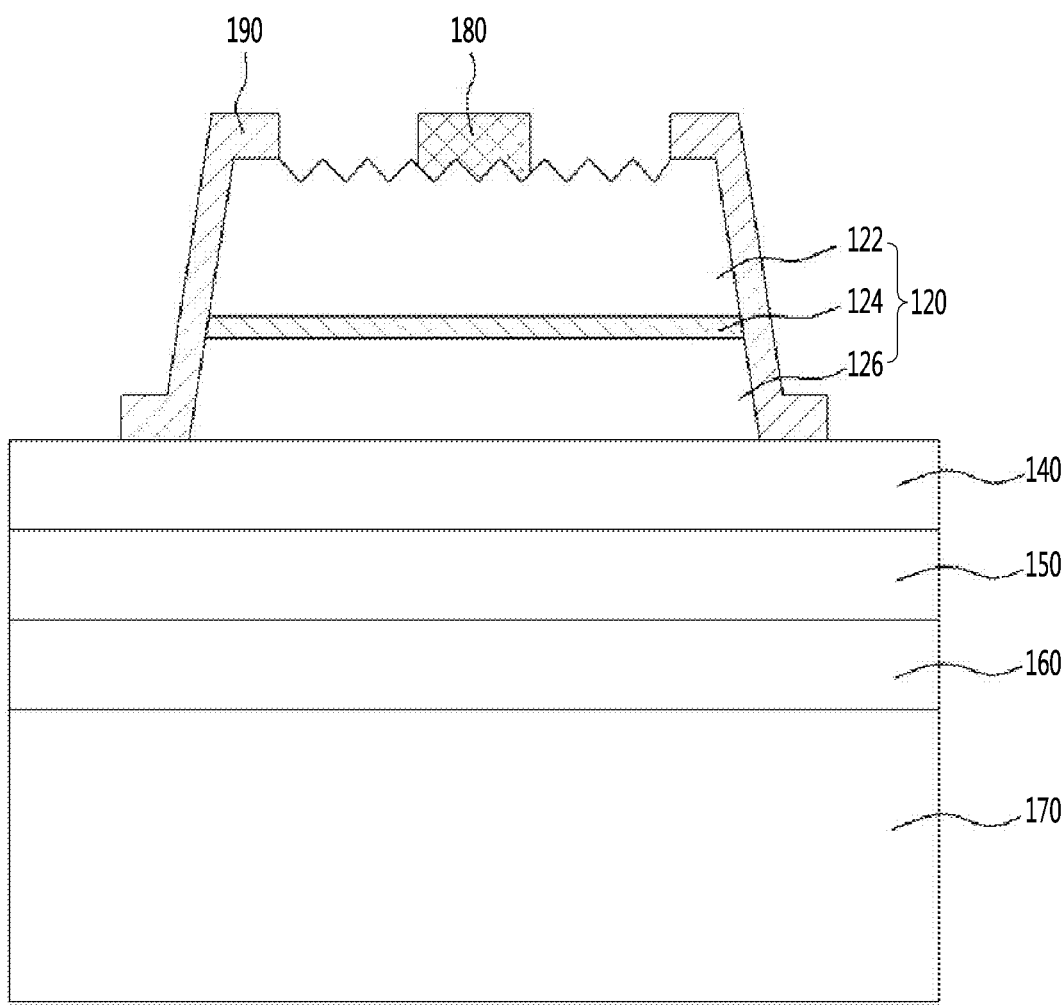

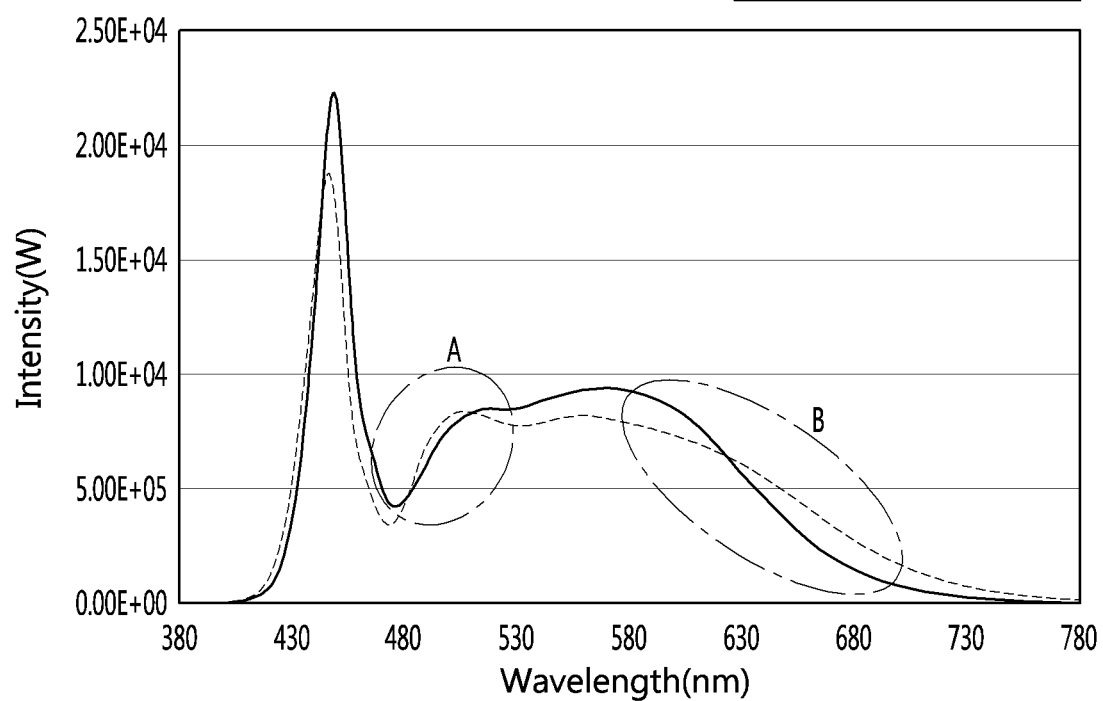

PHOSPHOR COMPOSITION, LIGHT-EMITTING DEVICE PACKAGE COMPRISING SAME, AND LIGHTING APPARATUS

This application is a U.S. National Stage Application under 35 U.S.C. § 371 of PCT Application No. PCT/KR2016/015097, filed Dec. 22, 2016, which claims priority to Korean Patent Application No. 10-2015-0184754, filed Dec. 23, 2015, whose entire disclosures are hereby incorporated by reference.

TECHNICAL FIELD

An embodiment relates to a phosphor composition including a cyan phosphor and a light emitting device package and a lighting device including the same.

BACKGROUND ART

Light emitting devices such as light emitting diodes and laser diodes using semiconductors III-V or II-VI compound semiconductors can be used for various colors such as red, green, blue, and ultraviolet, and it is possible to provide white light with high efficiency by using phosphor or color combination. Light emitting devices have low power consumption, semi-permanent lifetime, fast response speed, safety, and environment friendliness compared to conventional light sources such as fluorescent lamps and incandescent lamps.

In the method of providing white light, a fluorescent material is disposed on a blue or ultraviolet (UV) light emitting diode chip by a single chip type. Also, a white light is obtained by combining phosphor multi-chip type.

In the case of a multi-chip type, there is a typical method in which three kinds of chips of RGB (Red, Green, and Blue) are combined. In this case, the operation voltage of each chip is uneven, so there is a problem that the color coordinates are different due to the difference of power depending on relevant situations.

Further, in the case of implementing white light by a single chip, a method of using light emitted from a blue LED and exciting at least one of the phosphors using the light to obtain white light is used.

In addition, various phosphors have been developed to improve the color reproducibility while having a high luminance value when the light emitting device package is applied. In particular, needs for improving the color rendering index and improving the luminous flux are increasing.

DISCLOSURE

Technical Problem

It is an object of the present invention to provide a phosphor composition having improved color rendering index and luminous flux of emitted light.

Technical Solution

An embodiment includes a first phosphor that is excited by an excitation light source and emits light in a first wavelength range; a second phosphor excited by the excitation light source to emit light in a second wavelength range; and a third phosphor which is excited by the excitation light source and emits light in a third wavelength range.

The emission peak wavelength of the first phosphor may be 490 nm to 505 nm.

The emission peak wavelength of the second phosphor may be from 515 nm to 575 nm.

The emission peak wavelength of the third phosphor may be from 580 nm to 670 nm.

The first phosphor may be represented by at least one of $(Ba, Mg)_{3-a}Sl_{6-b}O_{3.5-c}N_{8.5-d}(Li, Cl, F, P)_{1-e}:Eu^{2+}{}_a$, $(Ba, Mg, Ca, Sr)_{3-f}Si_6O_3N_8:Eu^{2+}{}_f$, $(Ba, Mg, Ca, Sr)_{1-g}Si_2O_2N_2:Eu^{2+}{}_g$.

The second phosphor may be represented by at least one of $(Lu, Y, Gd)_{3-h}(Al, Ga)_5O_{12}:Ce^{3+}{}_h$, $La_{3-i}Si_6N_{11}:Ce^{3+}{}_i$.

The third phosphor may be at least one selected from the group consisting of $(Ca, Sr)_{1-j}AlSiN_3:Eu^{2+}{}_j$, $Sr_{2-k}Si_5N_8:Eu^{2+}{}_k$, $(Ba, Sr)_{2-l}Si_5N_8:Eu^{2+}{}_l$.

The first phosphor may be included 1 wt % to 15 wt %, the second phosphor may be included 75 wt % to 90 wt %, and the third phosphor may be included 2 wt % to 15 wt % based on 100 wt % of the total composition.

Another embodiment includes a light emitting device package, the light emitting device package has a body portion; a first electrode portion and a second electrode portion disposed on the body portion; a light emitting element disposed on the body portion and electrically connected to the first electrode portion and the second electrode portion; and a molding part disposed around the light emitting device and including the phosphor composition described above.

The phosphor composition may be included in an amount of 10% by weight to 30% by weight based on 100% by weight of the molding part.

The light emitting element can emit blue light, and the light emitting element package can emit white light.

Still another embodiment provides a lighting apparatus including the above-described light emitting device package as a light source.

Advantageous Effects

In the phosphor composition according to the embodiment and the light emitting device package and the lighting device including the same, the light emitted from the phosphor composition can increase intensity of light in the blue-green wavelength region, thereby the color rendering index can be improved, the wavelength of the light in the red wavelength region ca be shortened.

DESCRIPTION OF DRAWINGS

FIG. 4 is a figure illustrating an embodiment of a light emitting device in the light emitting device package of FIG. 3, FIG. 5A to 5C are diagrams showing the optical characteristics of the first embodiment of the phosphor composition together with a comparative example, FIG. 11 is a figure showing that the color rendering index and luminous flux of the phosphor composition including the first phosphor are improved.

MODE FOR INVENTION

Figure 1:
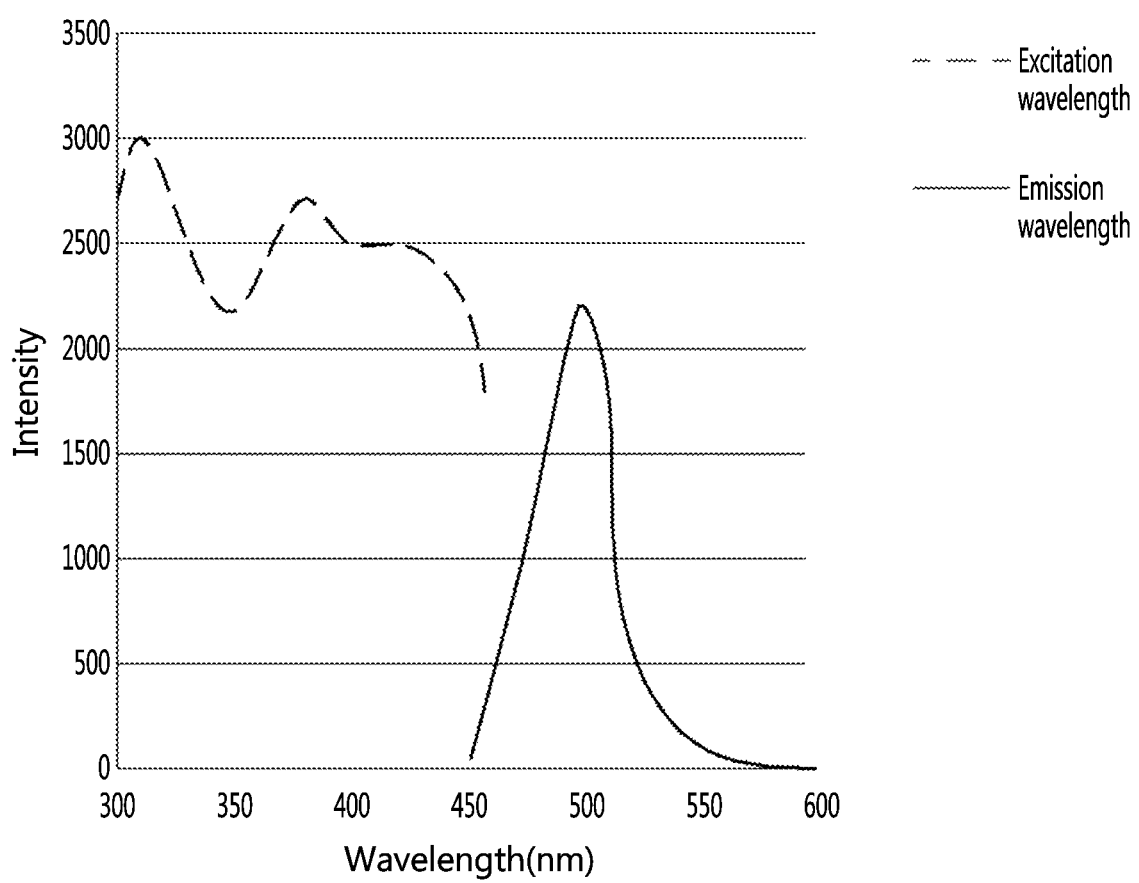
FIG. 1 is a diagram showing an emission wavelength and an excitation wavelength of a blue-green phosphor.

Hereinafter, embodiments of the present invention capable of achieving the above objects will be described with reference to the accompanying drawings.

In the description of embodiments according to the present invention, in the case of being described as being formed "on or under" of each element, the upper or lower or under are all such that two elements are in direct contact with each other or one or more other elements are indirectly formed between the two elements. Also, when expressed as "on or under", it may include not only an upward direction but also a downward direction based on an element.

It is also to be understood that the terms "first" and "second", "upper/upper portion/above" and "lower/lower portion/below" terms may be used solely to distinguish one entity or element from another entity or element, without necessarily requiring or implying that physical correlation or sequence.

The thickness and size of each layer in the drawings are exaggerated, omitted, or schematically shown for convenience and clarity of explanation. Also, the size of each component does not entirely reflect the actual size.

The phosphor composition of the embodiment comprises a cyan phosphor which is excited by an excitation light source and emits light in a first wavelength region of blue-green, a green phosphor which is excited by the excitation light source and emits light in a second wavelength region of green, and a red phosphor which emit red light in the third wavelength region of red. The excitation light source may be blue, but it is not limited thereto as long as it does not deviate from the object of the present invention. FIG. 1 is a diagram showing the emission wavelength and excitation wavelength of a blue-green phosphor.

The excitation wavelength of the cyan phosphor may include a blue light of 350 nm (nanometer) to 450 nm as shown, and a peak of the emission wavelength may be 490 nm to 505 nm, for example, the peak may be 498 nm.

The half-width of the light emitted from the blue-green phosphor may be about 32 nanometers, and phosphor particles having different diameters may be included. For example, the size of the phosphor particles whose size corresponds to 10% of the whole is 12.1 millimeters. The size of the phosphor particles having a size in the range of 50% of the whole can be 17.6 millimeters, and the size of the phosphor particles having a size in the range of 90% of the whole can be 27.0 millimeters.

The first phosphor can be represented by the formula (Ba, Mg)$_{3-a}$Si$_{6-b}$O$_{3.5-c}$N$_{8.5-d}$(Li, Cl, F, P)$_{1-e}$:Eu$^{2+}{}_a$, where $0.01 \leq a \leq 0.30$, $0.01 \leq b \leq 1.0$, $0.01 \leq c \leq 0.5$, $0.01 \leq d \leq 0.5$, $0.01 \leq e \leq 0.9$. Alternatively, the first phosphor may be represented by the formula (Ba, Mg, Ca, Sr)$_{3-f}$Si$_6$O$_3$N$_8$:Eu$^{2+}{}_f$ where $0.01 \leq f \leq 0.30$. Alternatively, the first phosphor may be represented by the formula (Ba, Mg, Ca, Sr)$_{1-g}$Si$_2$O$_2$N$_2$:Eu$^{2+}{}_g$, where $0.01 \leq g \leq 0.30$.

The second phosphor may be a LuAG-based phosphor or a YAG-based phosphor represented by the formula (Lu, Y, Gd)$_{3-h}$(Al, Ga)$_5$O$_{12}$:Ce$^{3+}{}_h$, where $0.01 \leq h \leq 0.50$. Alternatively, the second phosphor may be represented by the formula La$_{3-i}$Si$_6$N$_{ii}$:Ce$^{3+}{}_i$, where $0.01 < i < 0.50$.

The third phosphor may be represented by the formula (Ca, Sr)$_{1-j}$AlSiN$_3$:Eu$^{2+}{}_j$ where $0.01 \leq j \leq 0.30$. Alternatively, the third phosphor may be represented by Sr$_{2-k}$Si$_5$N$_8$:Eu$^{2+}{}_k$ and $0.01 \leq k \leq 0.30$. Alternatively, the third phosphor may be represented by (Ba, Sr)$_{2-l}$Si$_5$N$_8$:Eu$^{2+}{}_l$ and may be $0.01 \leq l \leq 0.30$.

Figure 2A:
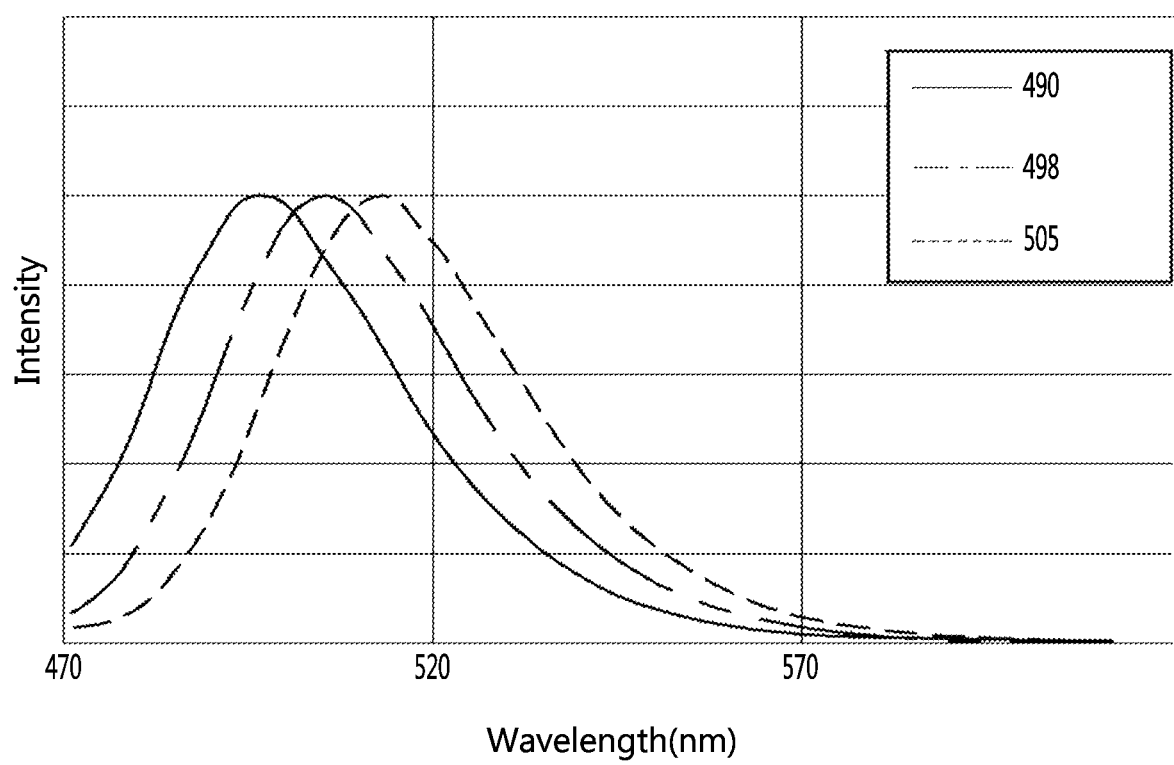
FIGS. 2A to 2C are graphs showing the intensities of light according to the wavelengths of the blue-green phosphor, the green phosphor and the red phosphor included in the phosphor composition.
Figure 2B:
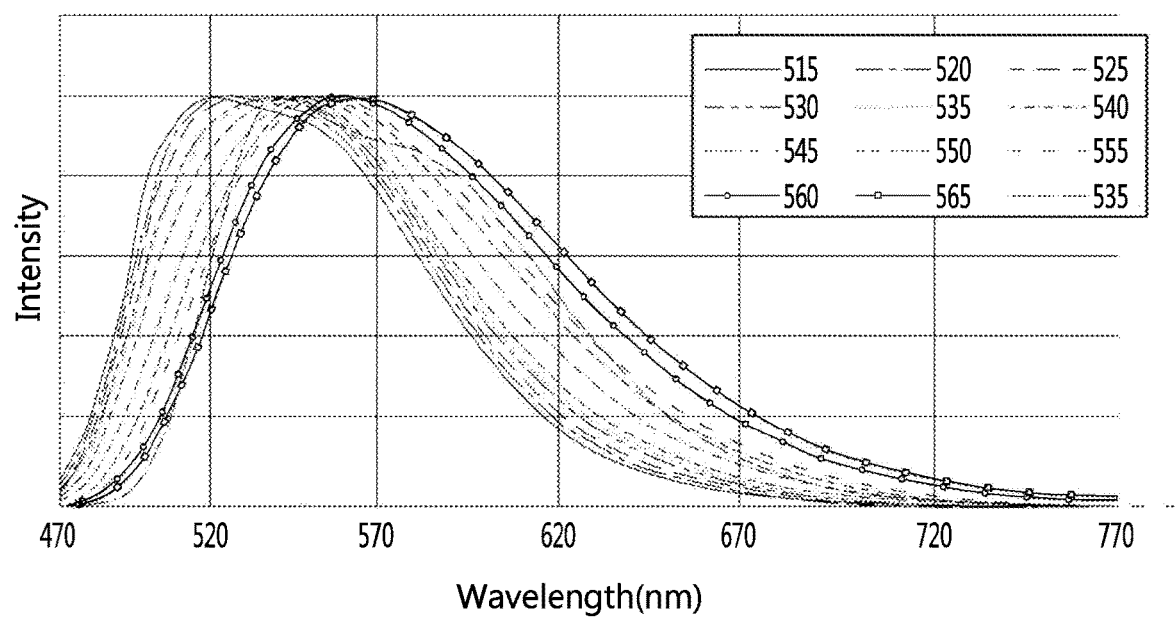
Figure 2C:
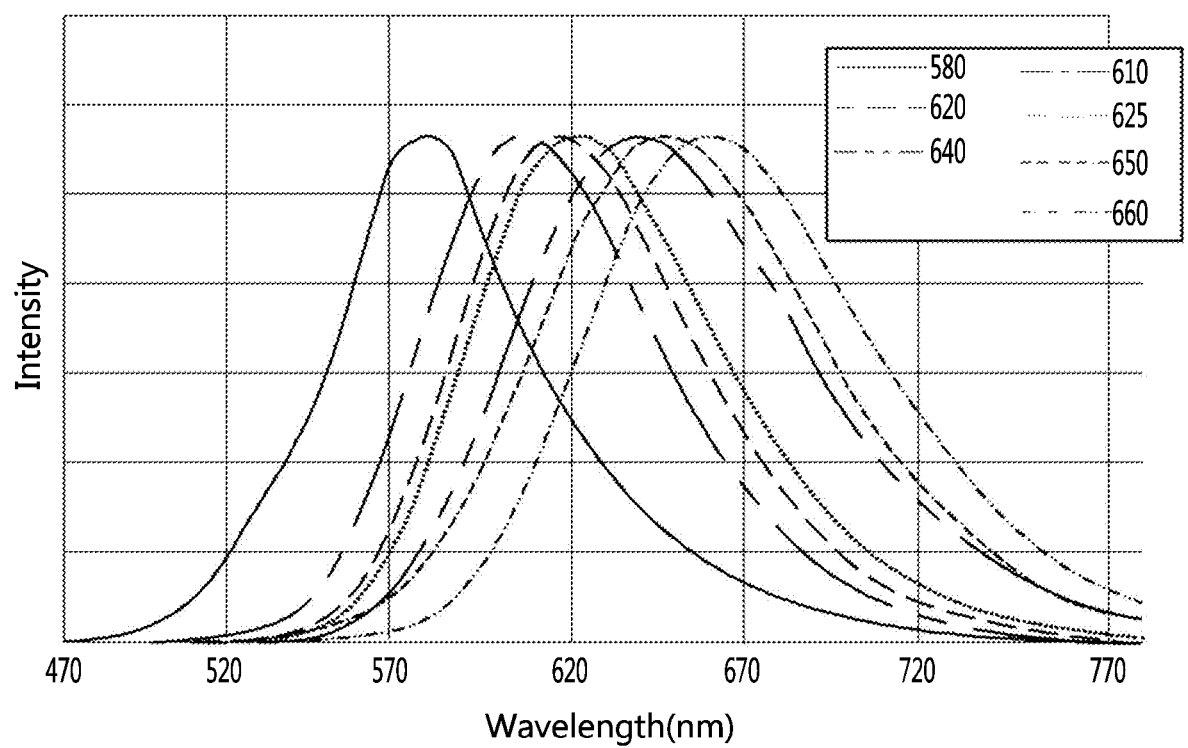

FIGS. 2A to 2C are diagrams showing the intensities of light according to the wavelengths of the blue-green phosphor, the green phosphor and the red phosphor included in the phosphor composition.

In FIG. 2A, the emission peak wavelength of the first phosphor emits light in the cyan wavelength range from 490 nm to 505 nm, the emission peak wavelength of the second phosphor in FIG. 2b emits light in the green wavelength range from 515 nm to 575 nm, The emission peak wavelength of the third phosphor emits light in the red wavelength range from 580 nm to 670 nm and the wavelength range and intensity of the emitted light may vary as the compositions of the first to third phosphors vary.

Figure 3:
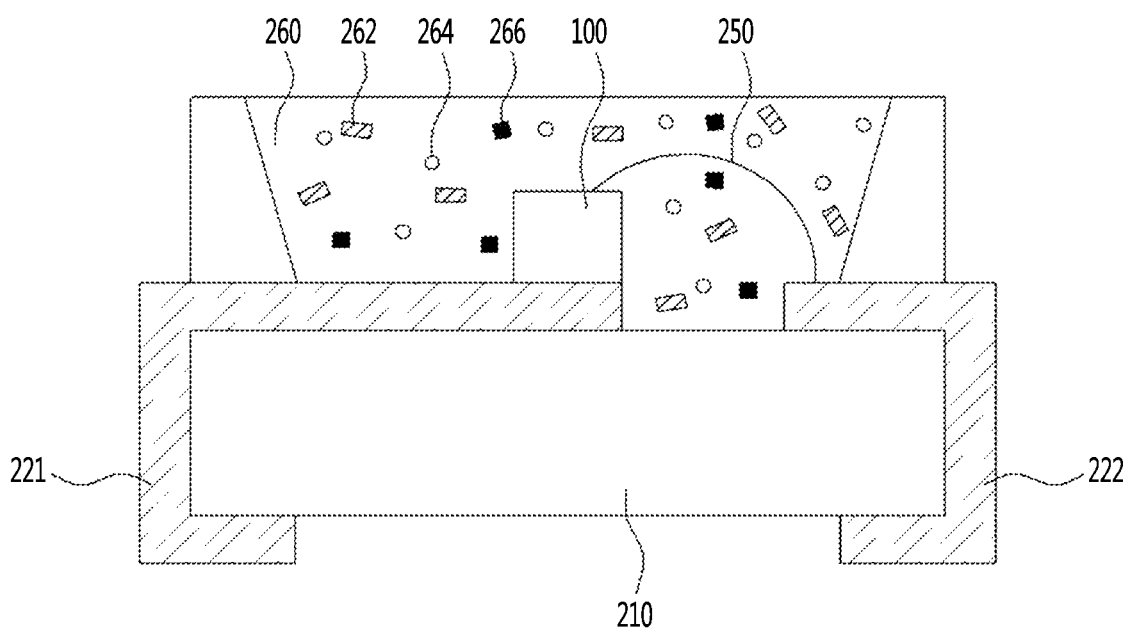
FIG. 3 is a figure showing an embodiment of a light emitting device package.

FIG. 3 is a figure illustrating an embodiment of the light emitting device package 200.

The light emitting device package 200 according to the embodiment may include a body 210, a cavity formed on the body 210, and a light emitting device 100 disposed in the cavity. And the light emitting device package 200 may include lead frames 221 and 222 for electrical connection with the printed circuit board 100. The light emitting device 100 may be disposed on the bottom surface of the cavity in the cavity and the molding portion 260 may be disposed on the cavity surrounding the light emitting device 100.

The molding part 260 may include the phosphor composition of the above-described embodiments.

The body 210 may be formed of a silicone material, a synthetic resin material, or a metal material. The body 210 may have a cavity having an open top and side and bottom surfaces.

The cavity may be formed in a cup shape, a concave container shape or the like, and the side surface of the cavity may be formed perpendicular or inclined with respect to the bottom surface, and may vary in size and shape.

The shape of the cavity viewed from above may be circular, polygonal, elliptical, or the like, and it may be a shape having a curved edge, but the present invention is not limited thereto.

The body 210 may include a first lead frame 221 and a second lead frame 222 to be electrically connected to the light emitting device 100. When the body portion 210 is made of a conductivity type material such as a metal material, although not shown, an insulating layer is coated on the surface of the body portion 210 to prevent an electrical short between the first and second lead frames 221 and 222.

The first lead frame 221 and the second lead frame 222 are electrically separated from each other and can supply a current to the light emitting device 100. The first lead frame 221 and the second lead frame 222 may reflect the light generated from the light emitting device 100 to increase the light efficiency and may radiant and discharge the heat generated from the light emitting device 100 to the outside.

The light emitting device 100 may be disposed in the cavity and disposed on the body 210 or on the first lead frame 221 or the second lead frame 222. The light emitting device 100 to be disposed may be a vertical light emitting device, a horizontal light emitting device, or the like.

FIG. 3, the light emitting device 100 may be disposed on the first lead frame 221 and the second lead frame 222 may be connected to the light emitting device 100 through the wire 250. However, the light emitting device 100 may be connected to the lead frame by a flip chip bonding or a die bonding method in addition to the wire bonding method.

In the light emitting device package 200 of FIG. 3, the molding part 260 protects the light emitting device 100 and fills the inside of the cavity.

Further, the molding part 260 may be formed to include the phosphor composition and the resin of the embodiment including the plurality of phosphors 262, 264, and 266.

The molding part 260 may include resin and phosphors 262, 264 and 266 and may be disposed to surround the light emitting device 100 to protect the light emitting device 100.

The resin that can be mixed and used with the phosphor composition in the molding part 260 may be any one of a silicone resin, an epoxy resin, and an acrylic resin or a mixture thereof.

The phosphors 262, 264, and 266 are excited by the light emitted from the light emitting device 100 to emit the wavelength-converted light. The phosphors 262, 264, and 266 may correspond to the first phosphor, the second phosphor, and the third phosphor, respectively.

Although not shown in the drawing, the molding part 260 may be arranged in a dome shape that fills the cavity and is higher than the side part height of the cavity. In order to adjust the light output angle of the light emitting device package 200, the molding part 260 may be arranged in a dome shape. The molding part may surround and protect the light emitting device 100 and function as a lens for changing a path of light emitted from the light emitting device 100.

FIG. 4 illustrates an embodiment of a light emitting device 100. The light emitting device 100 includes a support substrate 170, a light emitting structure 120, an ohmic layer 140, and a first electrode 180.

The light emitting structure 120 can include a first conductivity type semiconductor layer 122, an active layer 124, and a second conductivity type semiconductor layer 126.

The first conductivity type semiconductor layer 122 may be formed of a compound semiconductor such as a Group III-V or a Group II-VI, and may be doped with a first conductivity type dopant. The first conductivity type semiconductor layer 122 is a semiconductor material having a composition formula of $Al_xIn_yGa_{(1-x-y)}N$ ($0 \leq x \leq 1$, $0 \leq y \leq 1$, $0 \leq x+y \leq 1$), for example, any one of AlGaN, GaN, InAlGaN, AlGaAs, GaP, GaAs, GaAsP, and AlGaInP.

When the first conductivity type semiconductor layer 122 is an n-type semiconductor layer, the first conductivity type dopant may include n-type dopants such as Si, Ge, Sn, Se, and Te. The first conductivity type semiconductor layer 122 may be formed as a single layer or a multilayer, but the present invention is not limited thereto.

The active layer 124 can be disposed between the first conductivity type semiconductor layer 122 and the second conductivity type semiconductor layer 126 and can include a single well structure, a multiple well structure, a single quantum well structure, a multi quantum well (MQW) structure, a quantum dot structure, or a quantum wire structure.

The active layer may be formed of a compound semiconductor material such as a Group III-V. The active layer may have a pair structure having well layer and barrier layer such as one of AlGaN/AlGaN, InGaN/GaN, InGaN/InGaN, AlGaN/GaN, InAlGaN/GaN, GaAs (InGaAs)/AlGaAs, GaP (InGaP)/AlGaP, but is not limited thereto. The well layer may be formed of a material having an energy band gap smaller than the energy band gap of the barrier layer.

The second conductivity type semiconductor layer 126 may be formed of a semiconductor compound. The second conductivity type semiconductor layer 126 may be formed of a compound semiconductor such as a Group III-V or a Group II-VI, and may be doped with a second conductivity type dopant. The second conductivity type semiconductor layer 126 may be a semiconductor material having a composition formula of $In_xAl_yGa_{1-x-y}N$ ($0 \leq x \leq 1$, $0 \leq y \leq 1$, $0 \leq x+y \leq 1$), such as one of AlGaN, GaN AlInN, AlGaAs, GaP, GaAs, GaAsP, AlGaInP. For example, the second conductivity type semiconductor layer 126 may be made of $Al_xGa_{(1-x)}N$.

When the second conductivity type semiconductor layer 126 is a p-type semiconductor layer, the second conductivity type dopant may be a p-type dopant such as Mg, Zn, Ca, Sr, or Ba. The second conductivity type semiconductor layer 126 may be formed as a single layer or a multilayer, but the present invention is not limited thereto.

The surface of the first conductivity type semiconductor layer 122 has a pattern, and the light extraction efficiency can be improved. The first electrode 180 may be disposed on the surface of the first conductivity type semiconductor layer 122 and may be disposed on the surface of the first conductivity type semiconductor layer 122 on which the first electrode 180 is disposed, does not have a pattern. The first electrode 180 may be formed as a single layer or a multilayer structure including at least one of aluminum (Al), titanium (Ti), chromium (Cr), nickel (Ni), copper (Cu).

A passivation layer 190 may be formed around the light emitting structure 120. The passivation layer 190 may be made of an insulating material, and the insulating material may be made of a non-conductive oxide or nitride. For example, the passivation layer 190 may comprise a silicone oxide ($SiO_2$) layer, an oxy-nitride layer, and an aluminum oxide layer.

A second electrode may be disposed under the light emitting structure 120, and the ohmic layer 140 and the reflective layer 150 may serve as a second electrode. GaN may be disposed under the second conductivity type semiconductor layer 126 so that current or holes can be smoothly supplied to the second conductivity type semiconductor layer 126.

The ohmic layer 140 may have a thickness of about 200 Angstroms (Å). The ohmic layer 140 may be formed of indium tin oxide (ITO), indium zinc oxide (IZO), indium zinc tin oxide (IZTO), indium aluminum zinc oxide (IAZO), indium gallium zinc oxide (IGZO), indium gallium tin oxide), AZO (aluminum zinc oxide), ATO (antimony tin oxide), GZO (gallium zinc oxide), IZON (IZO nitride), AGZO (Al—Ga ZnO), IGZO, NiO, RuOx/ITO, Ni/IrOx/Au, and Ni/IrOx/Au/ITO, Ag, Ni, Cr, Ti, Al, Rh, Pd, Ir, Sn, In, Ru, Au, and Hf, and the present invention is not limited to these materials.

The reflective layer 150 may be formed of a metal such as molybdenum (Mo), aluminum (Al), silver (Ag), nickel (Ni), platinum (Pt), rhodium (Rh) or a metal layer of a composite material including Al, Ag, Pt or Rh. The reflective layer 150 effectively reflects the light generated in the active layer 124, thereby greatly improving the light extraction efficiency of the semiconductor device.

The support substrate 170 may be formed of a conductive material such as a metal or a semiconductor material. A metal having excellent electrical conductivity or thermal conductivity can be used for the support substrate 170, and a material having a high thermal conductivity (ex. Metal, etc.) can be used to radiate heat generated from operating light emitting device. For example, The support substrate 170 may be a material selected from the group consisting of molybdenum (Mo), silicon (Si), tungsten (W), copper (Cu) and aluminum (Al)), or an alloy thereof, also a gold (Au), copper alloy (Cu Alloy), a nickel (Ni), a copper-tungsten (Cu—W), a carrier wafer (for example, any one of GaN, Si, Ge, GaAs, ZnO, SiGe, SiC, SiGe, nd $Ga_2O_3$).

The support substrate 170 may have a thickness ranging from 50 to 200 μm so as to have a mechanical strength sufficient for separation into separate chips through a scribing process and a breaking process without causing warping of the entire nitride semiconductor.

The bonding layer 160 couples the reflective layer 150 and the support substrate 170 and may be formed of one of gold (Au), tin (Sn), indium (In), aluminum (Al), silicon (Si), silver (Ag), nickel (Ni) and copper (Cu), or an alloy thereof.

The embodiment of the light emitting device 100 shown in FIG. 4 is an embodiment of the vertical light emitting device. In the embodiment of the light emitting device package 200 shown in FIG. 3, in addition to the vertical light emitting device shown in FIG. 4, a light emitting device, and a flip chip type light emitting device may be disposed. In this case, the light emitting device 100 may emit light in a blue light wavelength range.

The embodiment of the light emitting device package of FIG. 4 including the light emitting device of one embodiment shown in FIG. 3 may emit white light.

In the first embodiment of the phosphor composition, the first phosphor cab be in a weight ratio of 1 wt % to 15 wt %, the second phosphor can be in a weight ratio of 75 wt % to 90 wt %, and the third phosphor can be included in a weight ratio of 2 wt % to 15 wt % . The phosphor may be included in the molding part of the light emitting device package at a weight ratio of 10 to 30 wt %. In detail, the first phosphor may be in a weight ratio of 5 wt % to 9 wt %, the second phosphor may be in a weight ratio of 82 wt % to 90 wt %, and the third phosphor may be included in a weight ratio of 4 wt % to 8 wt % The phosphor may be included in a weight ratio of 10 to 18 wt %.

Table 1 and Table 2 show the characteristics of light emitted from the light emitting device package including the phosphor composition according to the comparative example and the first embodiment, respectively, when the color temperature of the light emitted from the light emitting device package is 6500K (Kelvin).

TABLE 1

|  | lm | Cx | Cy | CCT | CRI | R9 |
| --- | --- | --- | --- | --- | --- | --- |
| Min | 6.07 | 0.312 | 0.322 | 6316 | 83.4 | 8 |
| Max | 6.21 | 0.316 | 0.329 | 6613 | 85.0 | 17 |
| Average | 6.13 | 0.314 | 0.325 | 6451 | 84.1 | 13 |

TABLE 2

|  | lm | Cx | Cy | CCT | CRI | R9 |
| --- | --- | --- | --- | --- | --- | --- |
| Min | 5.47 | 0.312 | 0.322 | 6308 | 89.0 | 50 |
| Max | 5.65 | 0.316 | 0.329 | 6622 | 92.5 | 68 |
| Average | 5.57 | 0.314 | 0.325 | 6450 | 90.7 | 58 |

Figure 5A:
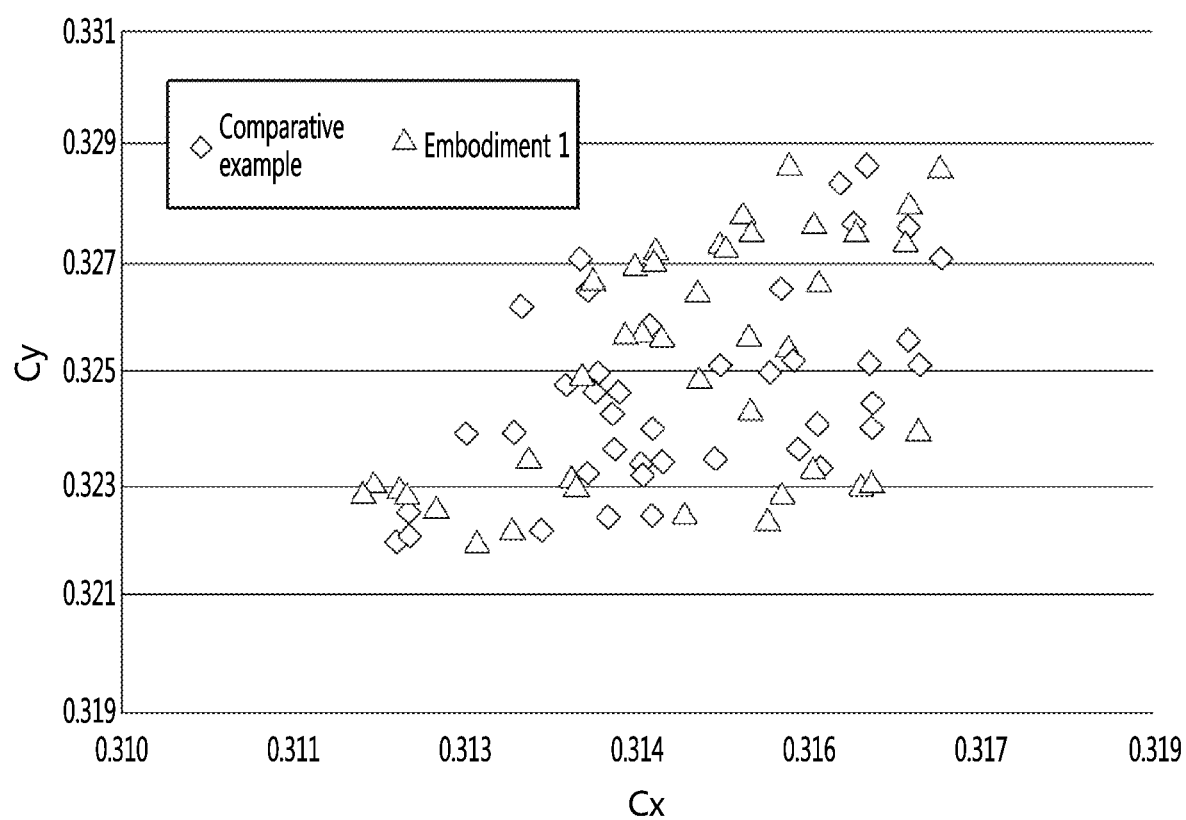
Figure 5B:
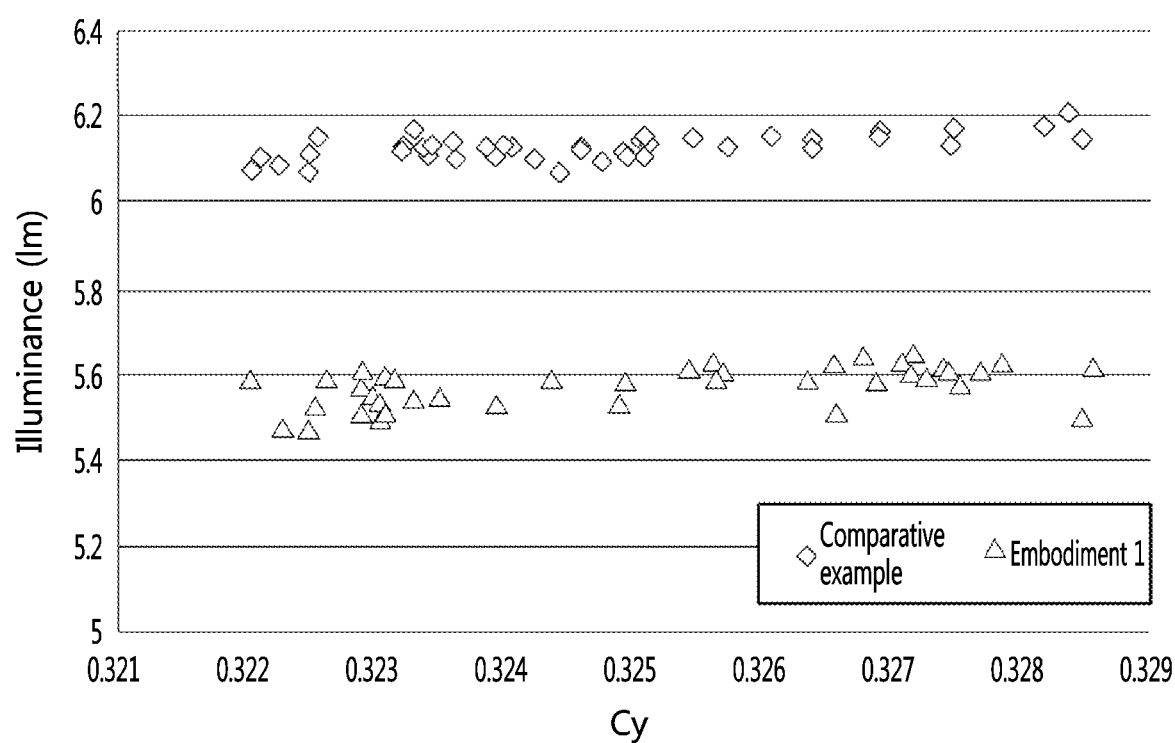
Figure 5C:
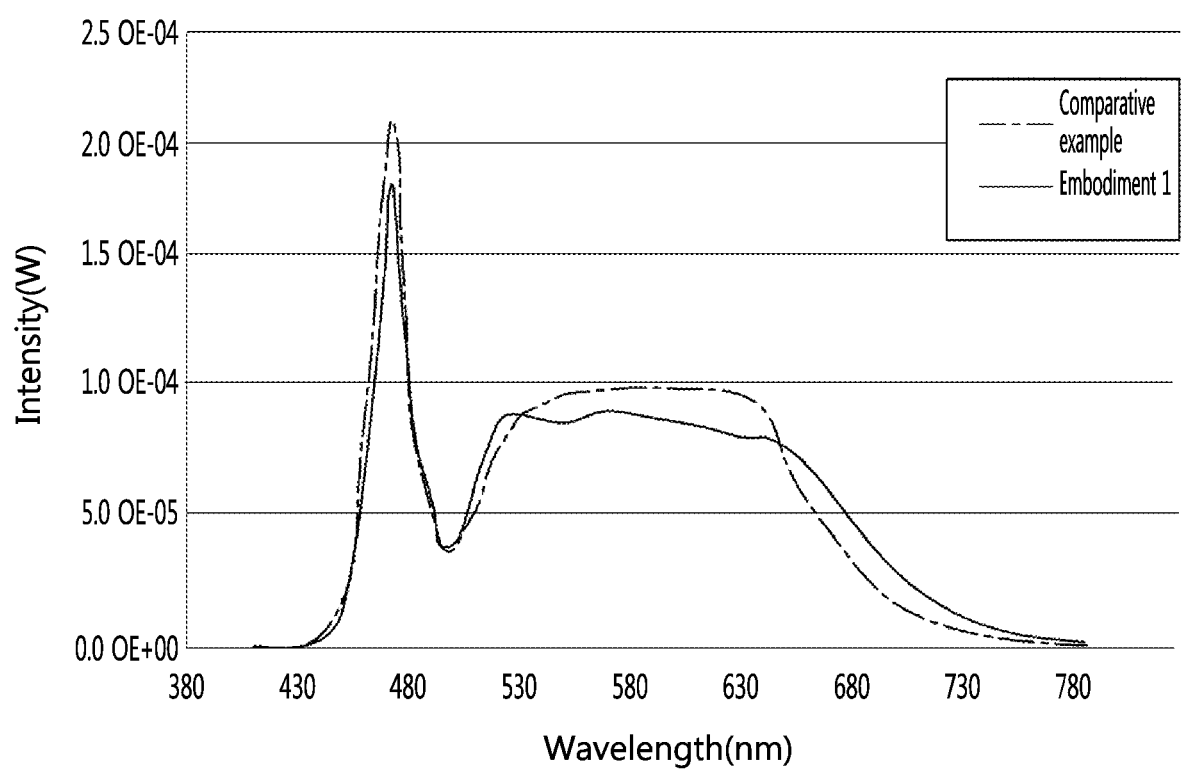

FIG. 5A to FIG. 5C show the optical characteristics of the first embodiment of the phosphor composition at this time together with a comparative example. In FIG. 5A, the horizontal axis represents the value of Cx and the vertical axis represents the value of Cy. In FIG. 5B, the vertical axis represents the illuminance (lm), and the horizontal axis represents the value of Cy. In FIG. 5C, the horizontal axis represents the wavelength, and the vertical axis represents the intensity (W), respectively.

In the comparative example, the green phosphor may be included at a weight ratio of 85 wt % to 95 wt %, and the red phosphor may be included at a weight ratio of 5 wt % to 15 wt %. The phosphor may be included in the molding part of the light emitting device package at a weight ratio of 10 to 30 wt %.

The color rendering index (CRI) and the color rendering index (R9) of the red region of the light emitting device package provided with the phosphor composition according to the first embodiment shown in Table 2 are improved compared to the (CRT) and R9 of the light emitting device package of the phosphor composition according to the comparative example shown in Table 1, and the correlated color temperature (CCT) is similar.

In the second and third embodiments of the phosphor composition, the first phosphor has a weight ratio of 1 wt % to 15 wt %, the second phosphor has a weight ratio of 75 wt % to 90 wt %, and the third phosphor has a weight ratio of 2 wt % to 15 wt % by weight. The phosphor may be included in the molding part of the light emitting device package at a weight ratio of 10 to 30 wt %. In detail, the first phosphor may be in a weight ratio of 5wt % to 9wt %, the second phosphor may be in a weight ratio of 82wt % to 90wt %, and the third phosphor may be included in a weight ratio of 5wt % to 9wt % The phosphor may be included in the molding part of the package at a weight ratio of 12 to 24 wt %.

Table 3, Table 4 and Table 5 show the light emitting device package having the phosphor composition according to the comparative example, the second embodiment and the third embodiment when the color temperature of the light emitted from the light emitting device package is 5000K (Kelvin) and show the characteristics of the emitted light.

TABLE 3

|  | lm | Cx | Cy | CCT | CRI | R9 |
| --- | --- | --- | --- | --- | --- | --- |
| Min | 6.63 | 0.340 | 0.350 | 4852 | 81.9 | −1 |
| Max | 6.86 | 0.350 | 0.358 | 5180 | 83.3 | 6 |
| Average | 6.77 | 0.345 | 0.354 | 5023 | 82.7 | 3 |

TABLE 4

|  | lm | Cx | Cy | CCT | CRI | R9 |
| --- | --- | --- | --- | --- | --- | --- |
| Min | 5.79 | 0.341 | 0.350 | 4897 | 90.4 | 57 |
| Max | 5.94 | 0.348 | 0.358 | 5173 | 91.9 | 66 |
| Average | 5.86 | 0.345 | 0.354 | 5032 | 91.3 | 62 |

TABLE 5

|  | lm | Cx | Cy | CCT | CRI | R9 |
| --- | --- | --- | --- | --- | --- | --- |
| Min | 6.31 | 0.341 | 0.350 | 4873 | 89.3 | 22 |
| Max | 6.47 | 0.349 | 0.359 | 5160 | 91.0 | 30 |
| Average | 6.38 | 0.345 | 0.354 | 5034 | 90.1 | 26 |

Figure 6A:
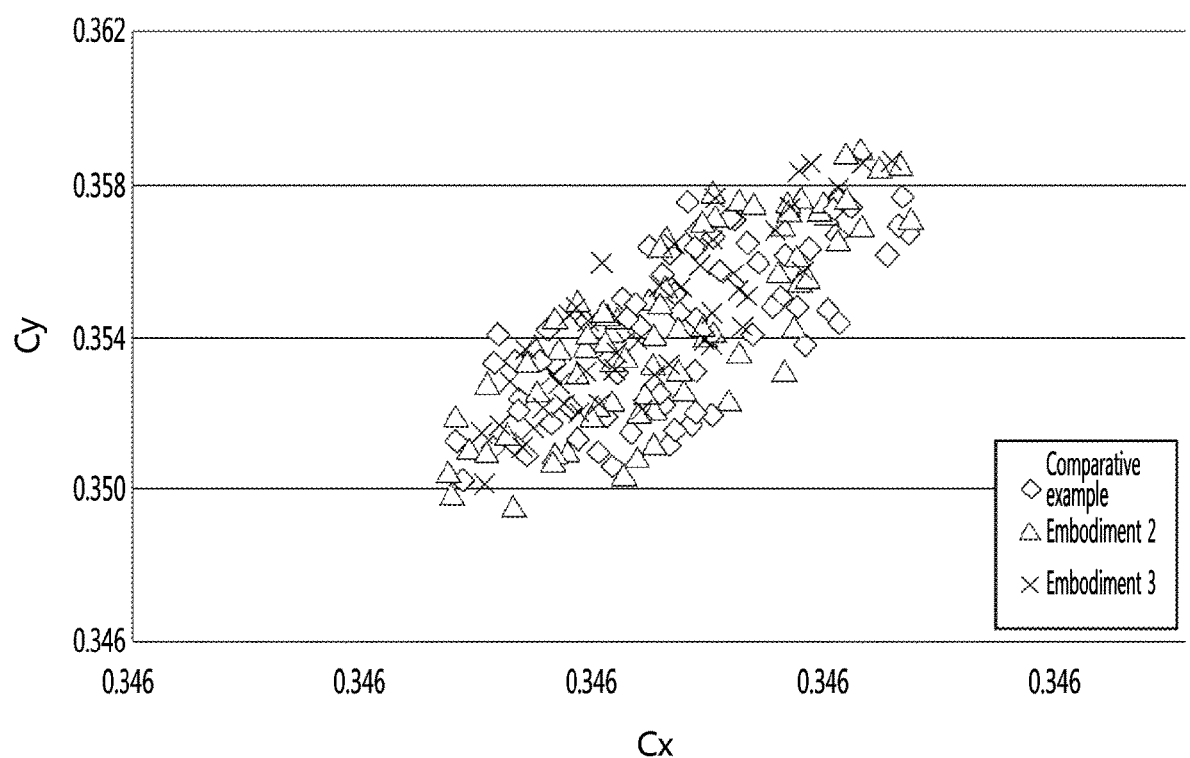
FIG. 6A to FIG. 6C are diagrams showing optical characteristics of the second and third embodiments of the phosphor composition together with a comparative example.
Figure 6B:
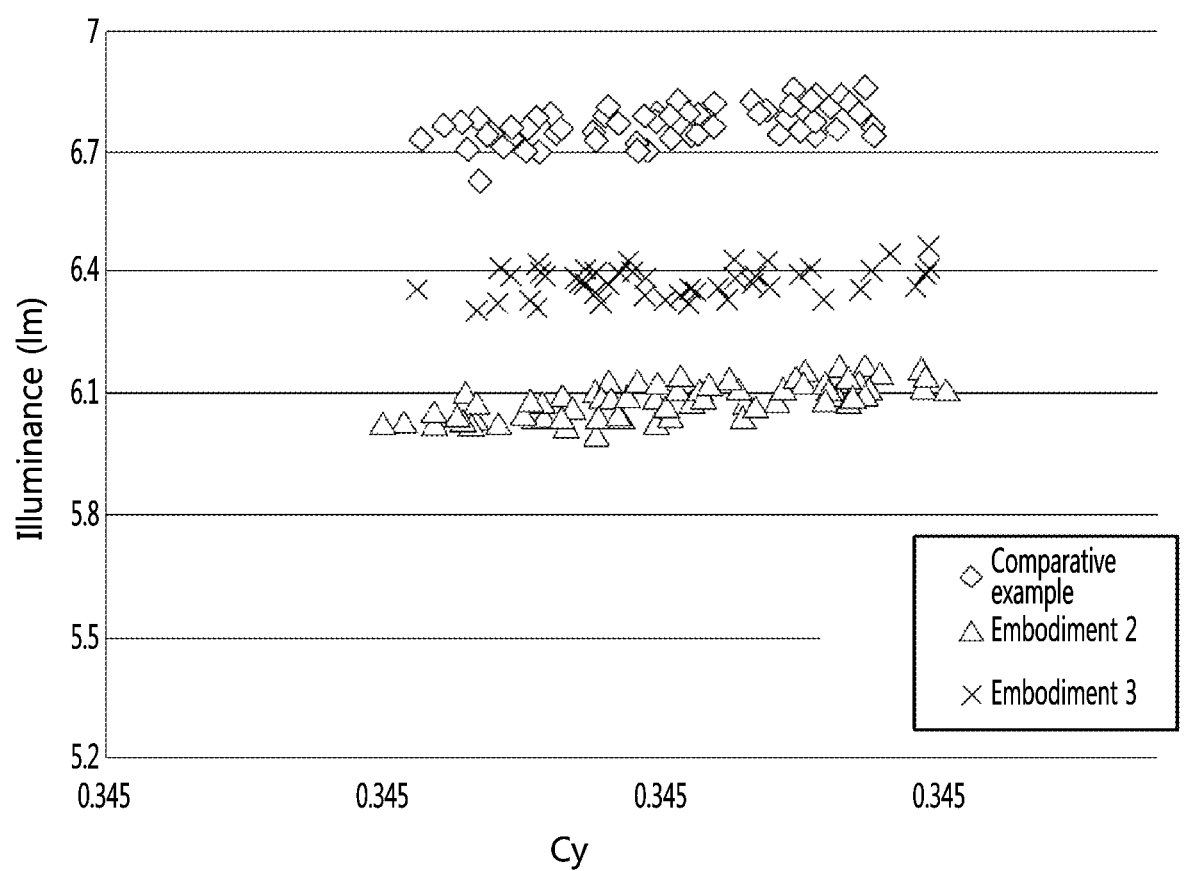
Figure 6C:
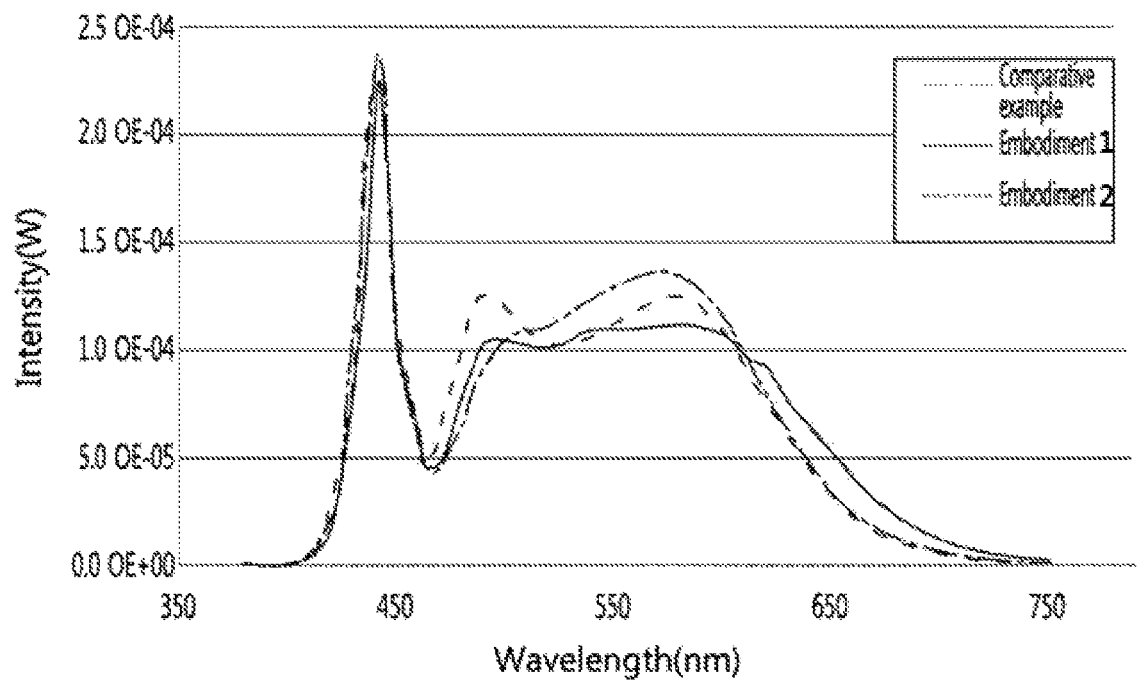

FIG. 6A to FIG. 6C show the optical characteristics of the second and third embodiments of the phosphor composition together with a comparative example. In FIG. 6A, the horizontal axis represents the value of Cx and the vertical axis represents the value of Cy. In FIG. 6B, the horizontal axis represents the value of Cy, and the vertical axis represents the illuminance (lm). In FIG. 6C, the horizontal axis represents the wavelength and the vertical axis represents the intensity (W), respectively.

In the comparative example, the green phosphor may be included at a weight ratio of 85 wt % to 95 wt %, and the red phosphor may be included at a weight ratio of 5 wt % to 15 wt %. The phosphor may be included in the molding part of the light emitting device package at a weight ratio of 10 to 30 wt %.

The color rendering index (CRI) and the color rendering index (R9) of the light emitting device package provided with the phosphor composition according to the second and third embodiments shown in Tables 4 and 5 are improved compared to the CRI and R9 of the light emitting device package provided with the phosphor composition according to the comparative example shown in Table 3.

In the fourth embodiment of the phosphor composition, the first phosphor is in a weight ratio of 1 wt % to 10 wt %, the second phosphor is in a weight ratio of 75 wt % to 90 wt %, and the third phosphor is included in a weight ratio of 2 wt % to 15 wt %. The phosphor may be included in the molding part of the light emitting device package at a weight ratio of 10 to 30 wt %. In detail, the first phosphor may be in a weight ratio of 5 wt % to 9 wt %, the second phosphor may be in a weight ratio of 82 wt % to 90 wt %, and the third phosphor may be included in a weight ratio of 6 wt % to 12 wt % The phosphor may be included in the molding part of the package at a weight ratio of 15 to 25 wt %.

Table 6 and Table 7 show the characteristics of light emitted from the light emitting device package including the phosphor composition according to the comparative example and the fourth embodiment, respectively, when the color temperature of the light emitted from the light emitting device package is 4000K (Kelvin).

TABLE 6

|  | lm | Cx | Cy | CCT | CRI | R9 |
| --- | --- | --- | --- | --- | --- | --- |
| Min | 6.42 | 0.376 | 0.375 | 3951 | 83.2 | 10 |
| Max | 6.52 | 0.384 | 0.382 | 4099 | 84.0 | 15 |
| Average | 6.47 | 0.380 | 0.378 | 4022 | 83.6 | 12 |

TABLE 7

|  | lm | Cx | Cy | CCT | CRI | R9 |
| --- | --- | --- | --- | --- | --- | --- |
| Min | 5.47 | 0.377 | 0.374 | 3924 | 91.6 | 60 |
| Max | 5.57 | 0.385 | 0.382 | 4090 | 93.1 | 67 |
| Average | 5.52 | 0.381 | 0.378 | 4007 | 92.3 | 63 |

Figure 7A:
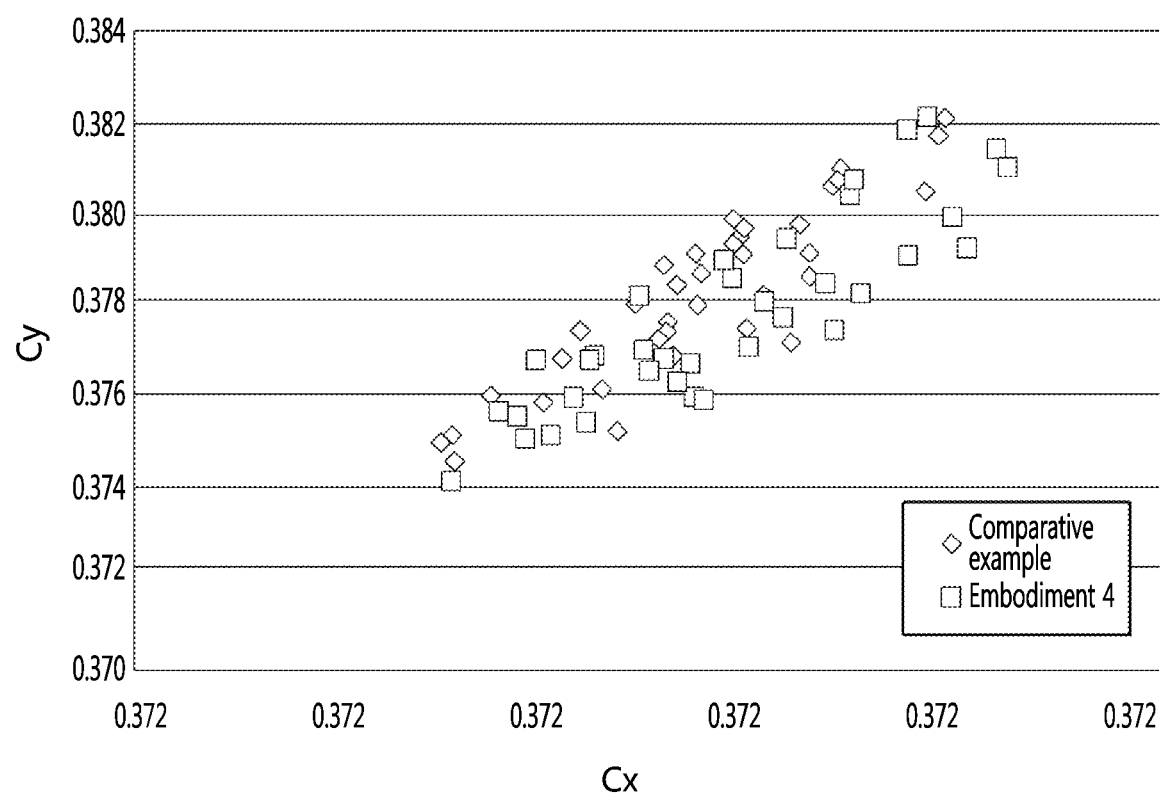
FIG. 7A to FIG. 7C are diagrams showing optical characteristics of a phosphor composition according to a fourth embodiment together with a comparative example.
Figure 7B:
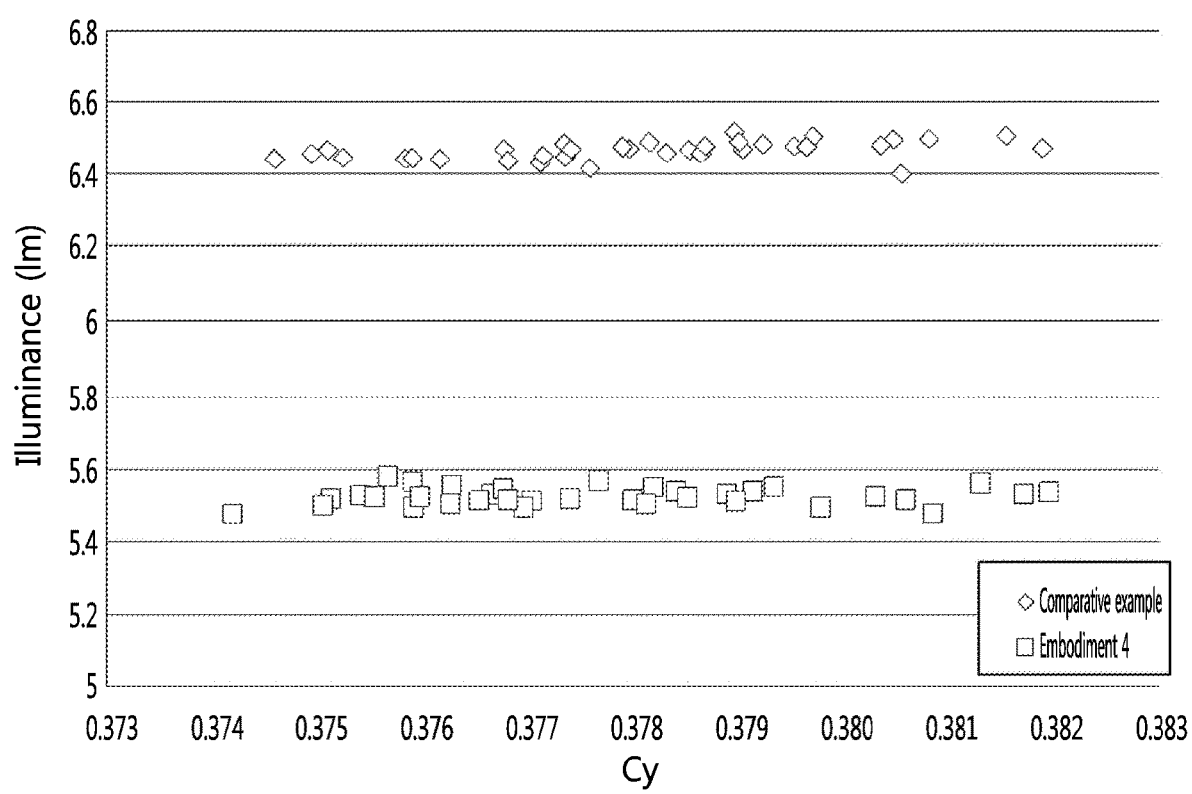
Figure 7C:
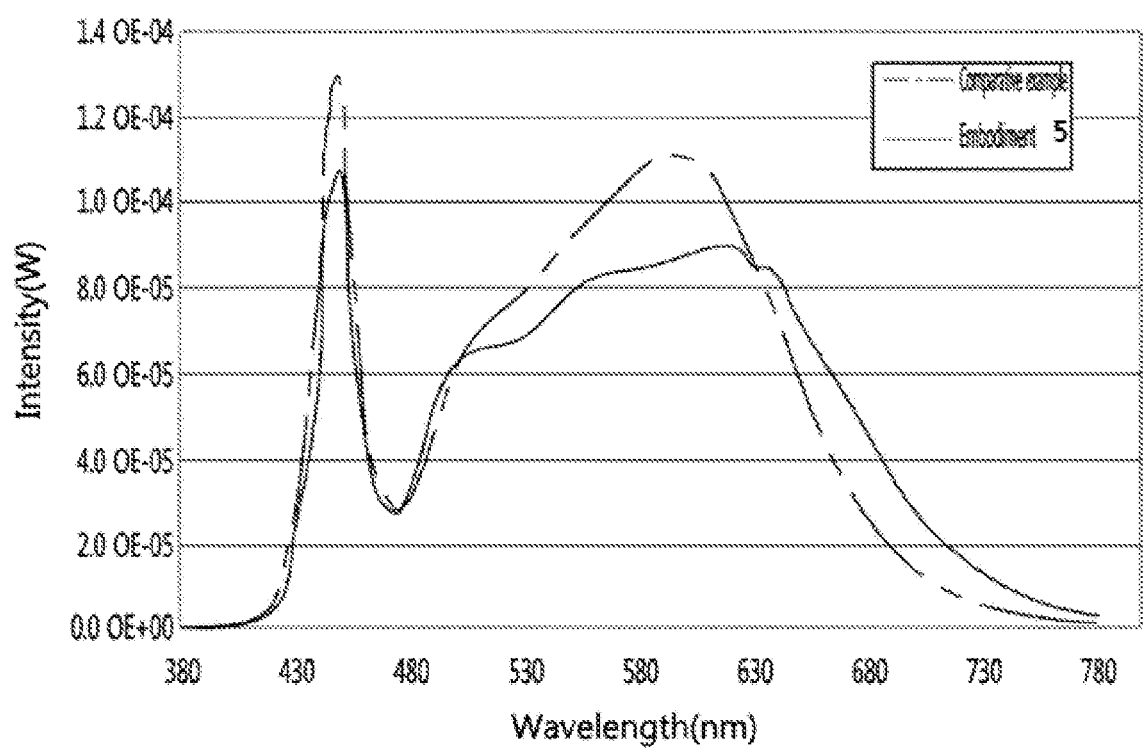

FIG. 7A to FIG. 7C show the optical characteristics of the fourth embodiment of the phosphor composition at this time together with a comparative example. In FIG. 7A, the horizontal axis represents the value of Cx and the vertical axis represents the value of Cy. In FIG. 7B, the horizontal axis represents the value of Cy, and the vertical axis represents the illuminance (lm). In FIG. 7C, the horizontal axis represents the wavelength and the vertical axis represents the intensity (W), respectively.

In the comparative example, the green phosphor may be included at a weight ratio of 85 wt % to 95 wt %, and the red phosphor may be included at a weight ratio of 5 wt % to 15 wt %. The phosphor may be included in the molding part of the light emitting device package at a weight ratio of 15 to 35 wt %.

The color rendering index (CRI) and the color rendering index (R9) of the light emitting device package provided with the phosphor composition according to the fourth embodiment shown in Table 7 are improved compared to the CRI and R9 of the light emitting device package provided with the phosphor composition according to the comparative example shown in Table 6.

In the fifth embodiment of the phosphor composition, the first phosphor is in a weight ratio of 1 wt % to 10 wt %, the second phosphor is in a weight ratio of 75 wt % to 90 wt %, and the third phosphor is included in a weight ratio of 2 wt % to 20 wt %. The phosphor may be included in the molding part of the light emitting device package at a weight ratio of 20 to 40 wt %. In detail, the first phosphor may be in a weight ratio of 2wt % to 7wt %, the second phosphor may be in a weight ratio of 77wt % to 85wt %, and the third phosphor may be included in a weight ratio of 12wt % to 18wt % The phosphor may be included in the molding part of the package in a weight ratio of 25 to 35 wt %.

Table 8 and Table 9 show the characteristics of light emitted from the light emitting device package including the phosphor composition according to the comparative example and the fifth embodiment, respectively, when the color temperature of the light emitted from the light emitting device package is 3000 K (Kelvin).

TABLE 8

|  | lm | Cx | Cy | CCT | CRI | R9 |
| --- | --- | --- | --- | --- | --- | --- |
| Min | 5.90 | 0.436 | 0.402 | 2933 | 81.6 | 3 |
| Max | 6.05 | 0.442 | 0.409 | 3040 | 82.6 | 8 |
| Average | 6.00 | 0.439 | 0.406 | 2989 | 82.1 | 5 |

TABLE 9

|  | lm | Cx | Cy | CCT | CRI | R9 |
| --- | --- | --- | --- | --- | --- | --- |
| Min | 5.02 | 0.434 | 0.403 | 2905 | 90.8 | 47 |
| Max | 5.23 | 0.444 | 0.409 | 3052 | 91.7 | 52 |
| Average | 5.13 | 0.439 | 0.406 | 2992 | 91.3 | 50 |

Figure 8A:
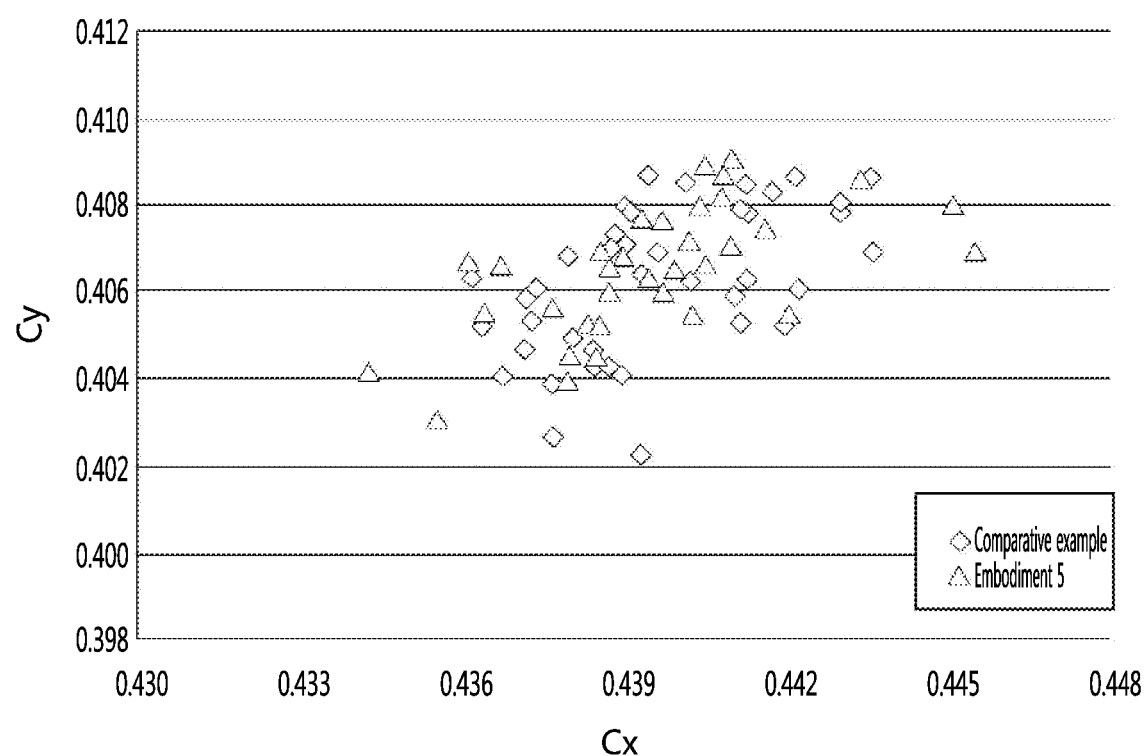
FIG. 8A to FIG. 8C are diagrams showing the optical characteristics of the fifth embodiment of the phosphor composition together with the comparative example.
Figure 8B:
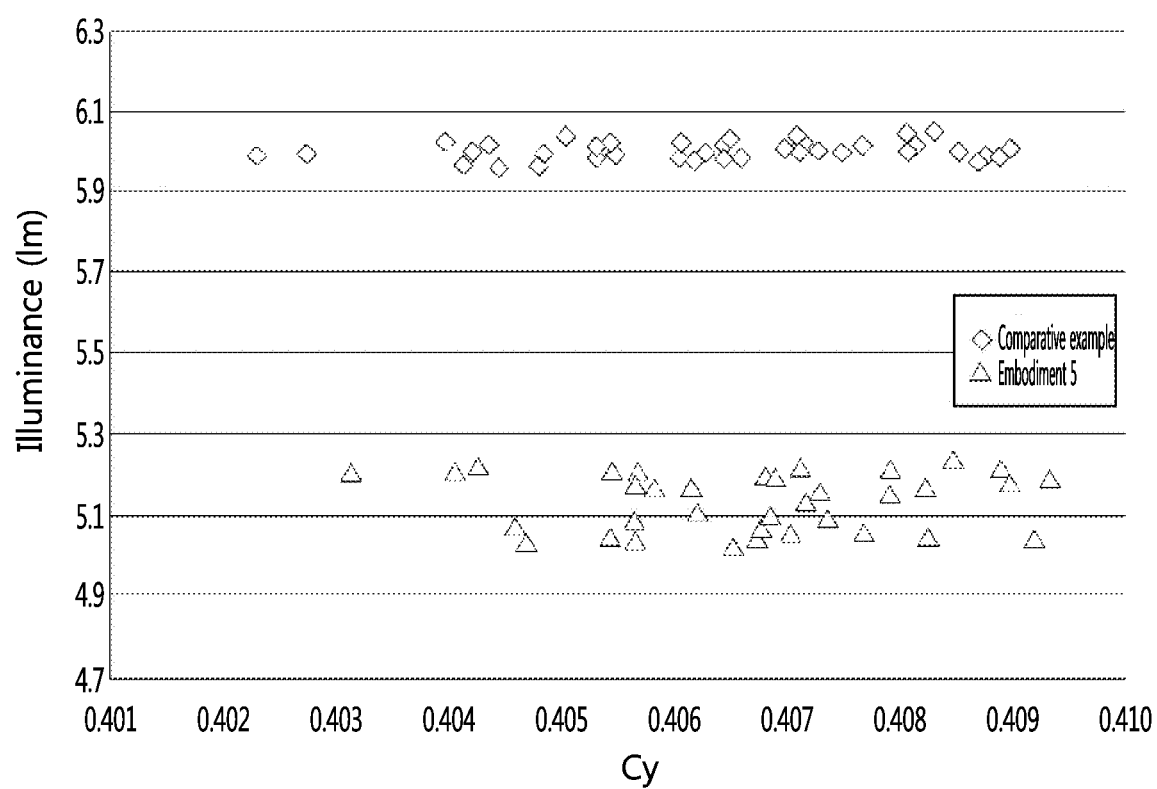
Figure 8C:
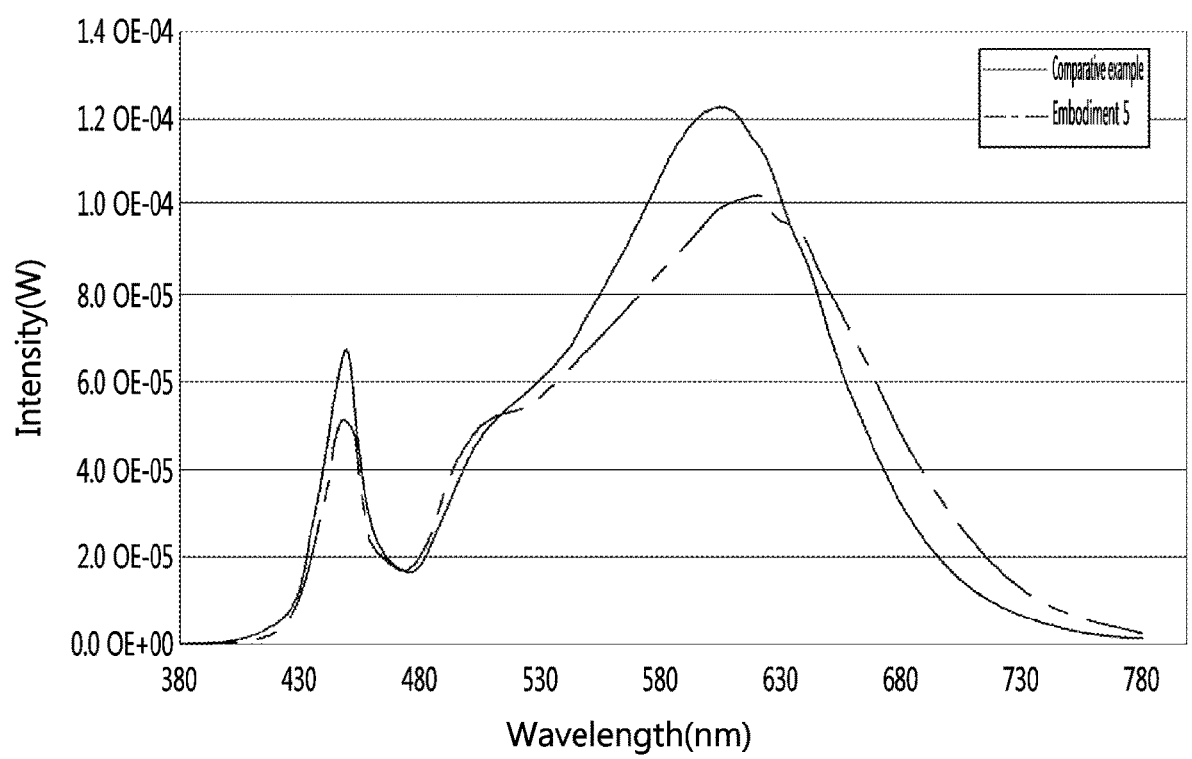

8A to 8C show the optical characteristics of the fifth embodiment of the phosphor composition at this time together with a comparative example. In FIG. 8A, the horizontal axis represents the value of Cx and the vertical axis represents the value of Cy. In FIG. 8B, the vertical axis represents the illuminance (lm), the horizontal axis represents the value of Cy. In FIG. 8C, the horizontal axis represents the wavelength, and the vertical axis represents the intensity (W), respectively.

In the comparative example, the green phosphor may be included at a weight ratio of 85 wt % to 95 wt %, and the red phosphor may be included at a weight ratio of 5 wt % to 15 wt %. The phosphor may be included in the molding part of the light emitting device package at a weight ratio of 20 to 40 wt %.

The color rendering index (CRI) and the color rendering index (R9) of the light emitting device package provided with the phosphor composition according to the fifth embodiment shown in Table 9 are improved compared to the CRI and R9 of the light emitting device package having the phosphor composition according to the comparative example shown in Table 8.

In the sixth embodiment of the phosphor composition, the first phosphor is in a weight ratio of 1 wt % to 10 wt %, the second phosphor is in a weight ratio of 75 wt % to 90 wt %, and the third phosphor is included in a weight ratio of 2 wt % to 20 wt % . The phosphor may be included in the molding part of the light emitting device package at a weight ratio of 25 to 45 wt %. In detail, the first phosphor may be in a weight ratio of 3wt % to 9wt %, the second phosphor may be in a weight ratio of 74wt % to 82wt %, and the third phosphor may be included in a weight ratio of 12wt % to 18wt % The phosphor may be included in the molding part of the package in a weight ratio of 30 to 40 wt %.

Tables 10 and 11 show the characteristics of light emitted from the light emitting device package including the phosphor composition according to the comparative example and the sixth embodiment, respectively, when the color temperature of light emitted from the light emitting device package is 2700K (Kelvin).

TABLE 10

|  | lm | Cx | Cy | CCT | CRI | R9 |
| --- | --- | --- | --- | --- | --- | --- |
| Min | 5.65 | 0.455 | 0.406 | 2677 | 82.5 | 9 |
| Max | 5.78 | 0.461 | 0.412 | 2760 | 83.7 | 14 |
| Average | 5.71 | 0.458 | 0.409 | 2709 | 83.6 | 12 |

TABLE 11

|  | lm | Cx | Cy | CCT | CRI | R9 |
| --- | --- | --- | --- | --- | --- | --- |
| Min | 4.65 | 0.455 | 0.406 | 2657 | 91 | 49 |
| Max | 4.99 | 0.461 | 0.412 | 2773 | 94 | 57 |
| Average | 4.83 | 0.458 | 0.409 | 2719 | 92 | 53 |

Figure 9A:
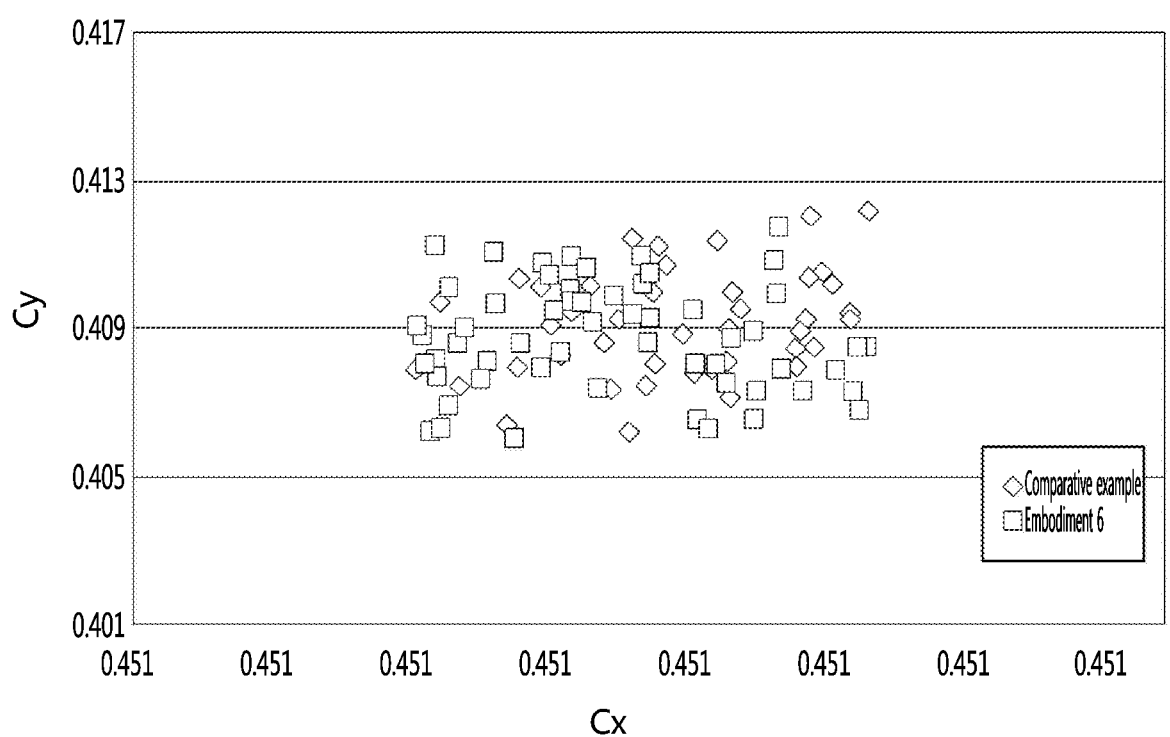
FIG. 9A to FIG. 9C are diagrams showing the optical characteristics of the phosphor composition according to the sixth embodiment together with a comparative example.
Figure 9B:
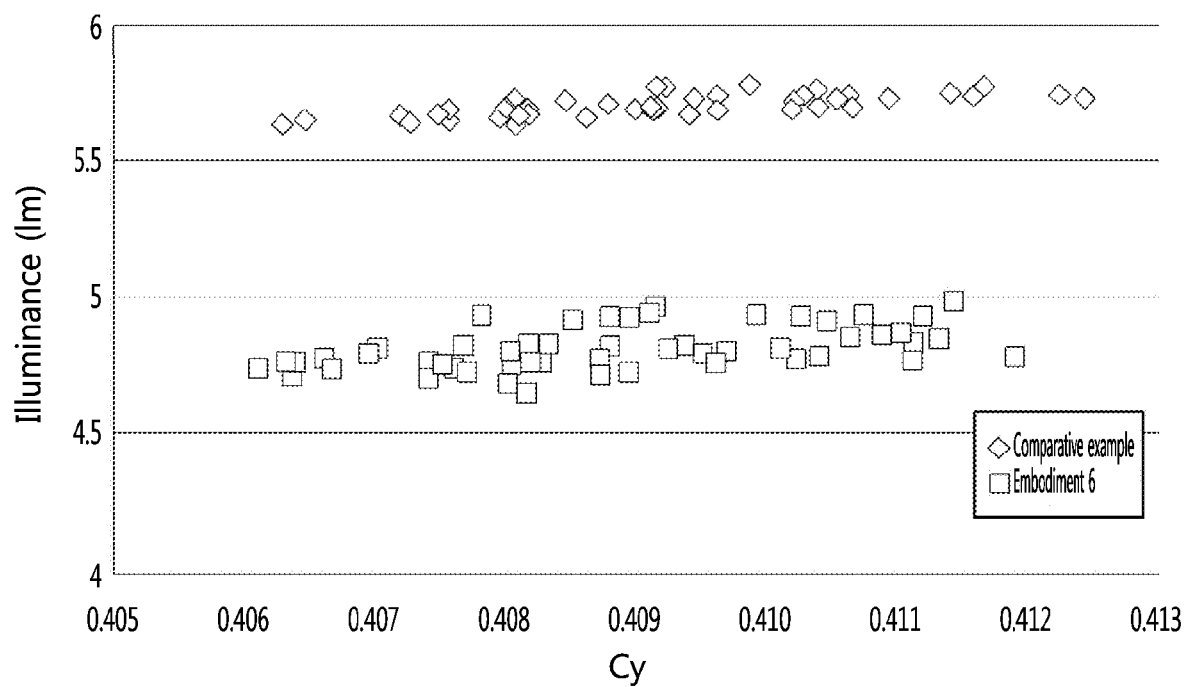
Figure 9C:
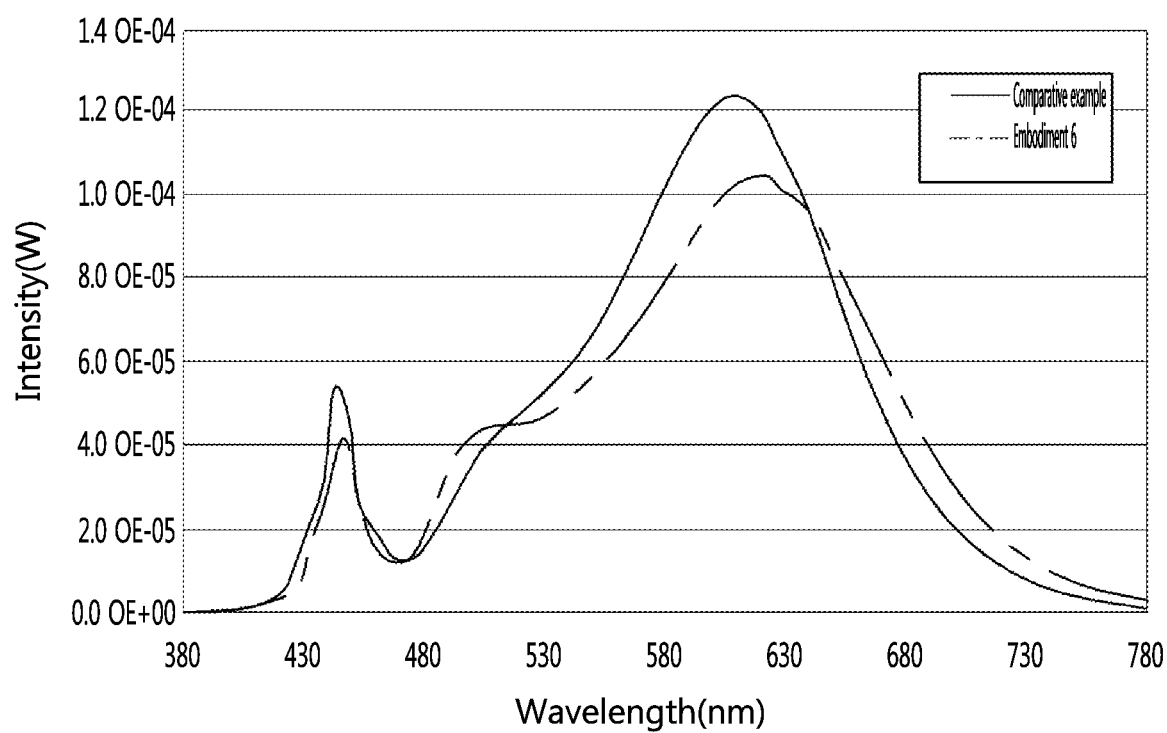

FIG. 9A to FIG. 9C show the optical characteristics of the sixth embodiment of the phosphor composition at this time together with the comparative example. In FIG. 9A, the horizontal axis represents the value of Cx and the vertical axis represents the value of Cy. In FIG. 9B, the horizontal axis represents the value of Cy, and the vertical axis represents the illuminance (lm). In FIG. 9C, the horizontal axis represents the wavelength, and the vertical axis represents the intensity (W), respectively.

In the comparative example, the green phosphor may be included at a weight ratio of 85 wt % to 95 wt %, and the red phosphor may be included at a weight ratio of 5 wt % to 15 wt %. The phosphor may be included in the molding part of the light emitting device package at a weight ratio of 15 to 35 wt %.

The color rendering index (CRI) and the color rendering index (R9) of the light emitting device package provided with the phosphor composition according to the sixth embodiment shown in Table 11 are improved compared to the CRI and R9 of the light emitting device package having the phosphor composition according to the comparative example shown in Table 11.

Figure 10:
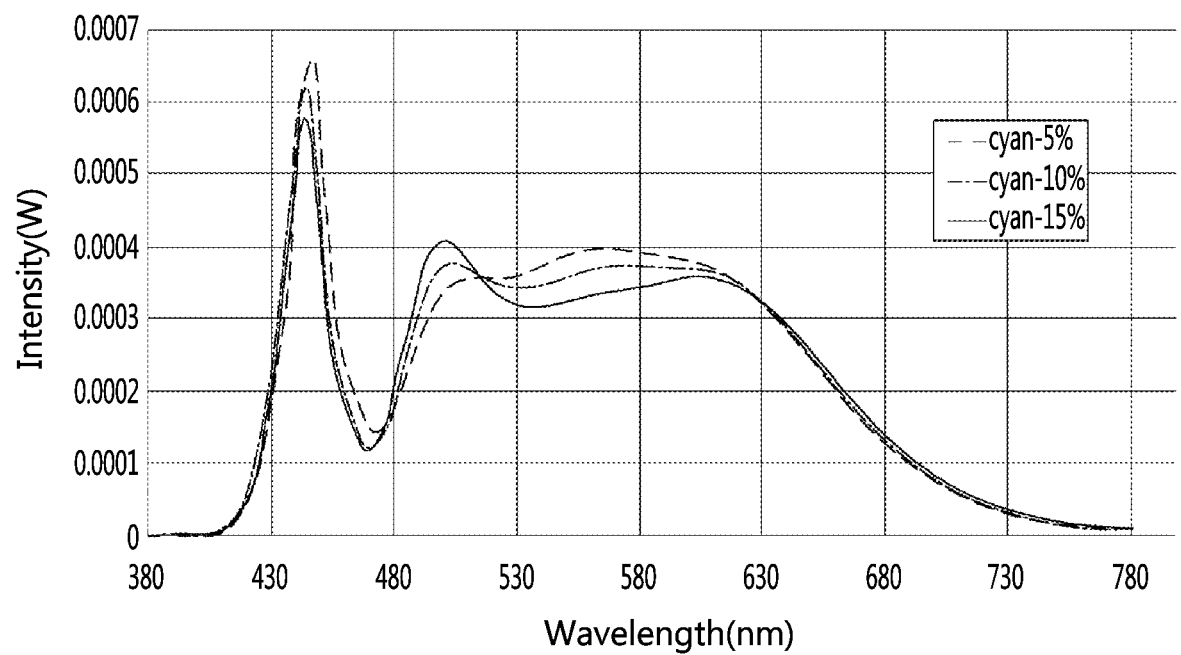
FIG. 10 is a graph showing changes in wavelength and intensity of red light according to the weight ratio of the first phosphor in the phosphor composition.

FIG. 10 is a graph showing changes in the wavelength and intensity of red light according to the weight ratio of the first phosphor in the phosphor composition. As the weight ratio of the cyan phosphor as the first phosphor increases, the intensity of the spectrum around 495 nm gradually increases. Specifically, the intensity of the fluorescent light increases from 2.5% to 3% each time the weight ratio of the first phosphor increases by 1 wt %, the intensity of the spectrum at 555 nm is gradually decreased, and in detail, when the weight ratio of the first phosphor is increased by 1 wt %, the intensity is decreased by 1.5% to 2%, the intensity of the spectrum in the red wavelength region gradually increases by 0.2% when the weight ratio of the first phosphor is increased by 1 wt %.

FIG. 11 is a figure showing that the first phosphor is included and the color rendering index and luminous flux of the phosphor composition are improved.

The light emitted from the phosphor composition according to the embodiments including the cyan phosphor emitting light in the cyan wavelength region as the first phosphor is emitted from the phosphor composition according to the comparative example shown by the solid line The color rendering index is improved in the region A, the wavelength of the light in the red wavelength region is shortened in the region B, and the luminous flux is improved as compared with the emitted light.

Hereinafter, an image display apparatus and a lighting apparatus will be described as an embodiment of an illumination system in which a light emitting device package 200 having the above-described phosphor composition is disposed.

A plurality of light emitting device packages 200 according to the embodiments may be arrayed on a substrate, and a light guide plate, a prism sheet, a diffusion sheet, or the like may be disposed on the light path of the light emitting device package 200. The light emitting device package 200, the substrate, and the optical member may function as a backlight unit.

Further, the display device, the indicating device, and the lighting device including the light emitting device package 200 according to the embodiment can be realized.

The display device includes a bottom cover, a reflector disposed on the bottom cover, a light emitting module for emitting light, a light guide plate disposed in front of the reflector for guiding light emitted from the light emitting module forward, an image signal output circuit connected to the display panel and supplying an image signal to the display panel; and a color filter disposed in front of the display panel. Here, the bottom cover, the reflector, the light emitting module, the light guide plate, and the optical sheet may form a backlight unit.

In addition, the illumination device includes a substrate, a light source module including the light emitting device package 200 according to the embodiment, a heat sink for dissipating heat of the light source module, and an electric signal provided from the outside, and a power supply unit. For example, the lighting device may include a lamp, a headlamp, or a streetlight.

The head lamp includes a light emitting module including light emitting device packages 200 disposed on a substrate, a reflector that reflects light emitted from the light emitting module in a predetermined direction, for example, forward, and a shade that reflects light reflected by the reflector and blocks or reflects a part of the light that is directed to the lens, thereby providing a designer with a desired light distribution pattern.

By using the phosphor composition or the light emitting device package of the embodiment described above in the case of the video display device and the lighting device described above, the light flux and the color reproduction rate can be improved. In addition, under the high temperature condition, it is possible to reduce the decrease in the optical characteristics of the light emitting device and improve the reliability.

While the present invention has been described with reference to exemplary embodiments, it is to be understood that the invention is not limited to the disclosed exemplary embodiments, but, on the contrary, is intended to cover various modifications and equivalent arrangements included within the spirit and scope of the appended claims. It will be understood that various modifications and applications are possible. For example, each component specifically shown in the embodiments can be modified and implemented. It is to be understood that the present invention may be embodied in many other specific forms without departing from the spirit or essential characteristics thereof.

The invention claimed is:

1. A phosphor composition comprising:
   a first phosphor excited by an excitation light source to emit light in a first wavelength range as a cyan wavelength range;
   a second phosphor excited by the excitation light source to emit light in a second wavelength range as a green wavelength range; and
   a third phosphor that is excited by the excitation light source and emits light in a third wavelength range as a red wavelength range,
   wherein the emission peak wavelength of the first phosphor is from 490 nm to 498 nm, and the emission peak wavelength of the second phosphor is from 515 nm to 575 nm, and the emission peak wavelength of the third phosphor is from 580 nm to 670 nm,
   wherein a material of the first phosphor is different from that of the second phosphor,
   wherein the first phosphor is represented by at least one of the following formula (1):

$(Ba, Mg)_{3-a}Si_{6-b}O_{3.5-c}N_{8.5-d}(Li,Cl, F, P)_{1-e}:Eu^{2+}_{a}$ (where, $0.01 \leq a \leq 0.30$, $0.01 \leq b \leq 1.0$, $0.01 \leq c \leq 0.5$, $0.01 \leq d \leq 0.5$, $0.01 \leq e \leq 0.9$), [formula 1]

wherein the second phosphor is represented by at least one of the following formulas (4) and (5):

$(Lu, Y, GdGa)_{3-h}(Al, Ga)_5O_{12}:Ce^{3+}_h$ $0.01 \leq h \leq 0.50$ [formula 4]

$La_{3-i}Si_6Ni_{11}:Ce^{3+}_i$ $0.01 \leq i \leq 0.50$, and [formula 5]

wherein the third phosphor is represented by at least one of the following formulas (6), (7) and (8):

$(Ca, Sr)_{1-j}AlSiN_3:Eu^{2+}_j$ $0.01 \leq j \leq 0.30$ [formula 6]

$Sr_{2-k}Si_5N_8:Eu^{2+}_k$ $0.01 \leq k \leq 0.30$ [formula 7]

$(Ba, Sr)_{2-l}Si_5N_8:Eu^{2+}_l$ $0.01 \leq l \leq 0.30$. [formula 8]

2. The phosphor composition according to claim 1, wherein the first phosphor is 1 wt % to 15 wt %, the second phosphor is 75 wt % to 90 wt %, and the third phosphor is 2 wt % to 15 wt % based on 100 wt % of the total composition.

3. A light emitting device package comprising:
   a body portion;
   a first electrode portion and a second electrode portion disposed on the body portion;
   a light emitting element disposed on the body portion and electrically connected to the first electrode portion and the second electrode portion; and
   a molding part formed to include the phosphor composition of claim 1 and disposed to surround the light emitting device.

4. The light emitting device package according to claim 3, wherein the phosphor composition is included in an amount of 10% by weight to 30% by weight based on 100% by weight of the molding part.

5. The light emitting device package of claim 3, wherein the light emitting device emits blue light.

6. The light emitting device package according to claim 3, wherein the light emitting device package emits white light.

7. A lighting apparatus comprising the light emitting device package of claim 3 as a light source.

8. A phosphor composition comprising:
   a first phosphor excited by an excitation light source to emit light in a first wavelength range as a cyan wavelength range;
   a second phosphor excited by the excitation light source to emit light in a second wavelength range as a green wavelength range; and
   a third phosphor that is excited by the excitation light source and emits light in a third wavelength range as a red wavelength range,
   wherein the emission peak wavelength of the first phosphor is from 490 nm to 498 nm, and the emission peak wavelength of the second phosphor is from 515 nm to 575 nm, and the emission peak wavelength of the third phosphor is from 580 nm to 670 nm,
   wherein a material of the first phosphor is different from that of the second phosphor,
   wherein the first phosphor is represented by at least one of the following formulas (2):

$(Ba, Mg, Ca, Sr)_{3-f}Si_6O_3N_8:Eu^{2+}_f$ (where, $0.01 \leq f \leq 0.30$), [formula 2]

wherein the second phosphor is represented by at least one of the following formulas (4) and (5):

$(Lu, Y, Gd)_{3-h}(Al, Ga)_5O_{12}:Ce^{3+}_h$ $0.01 \leq h \leq 0.50$ [formula 4]

$La_{3-i}Si_6N_{11}:Ce^{3+}_i$ $0.01 \leq i \leq 0.50$. [formula 5]

wherein the third phosphor is represented by at least one of the following formulas (6), (7) and (8):

$(Ca, Sr)_{1-j}AlSiN_3:Eu^{2+}_j$ $0.01 \leq j \leq 0.30$ [formula 6]

$Sr_{2-k}Si_5N_8:Eu^{2+}_k$ $0.01 \leq k \leq 0.30$ [formula 7]

$(Ba, Sr)_{2-l}Si_5N_8:Eu^{2+}_l$ $0.01 \leq l \leq 0.30$. [formula 8]

9. The phosphor according to claim 8, wherein the first phosphor is 1 wt % to 15 wt %, the second phosphor is 75 wt % to 90 wt %, and the third phosphor is 2 wt % to 15 wt % based on 100 wt % of the total composition.

10. A phosphor composition comprising:
   a first phosphor excited by an excitation light source to emit light in a first wavelength range as a cyan wavelength range;
   a second phosphor excited by the excitation light source to emit light in a second wavelength range as a green wavelength range; and
   a third phosphor that is excited by the excitation light source and emits light in a third wavelength range as a red wavelength range,
   wherein the emission peak wavelength of the first phosphor is from 490 nm to 498 nm, and the emission peak wavelength of the second phosphor is from 515 nm to 575 nm, and the emission peak wavelength of the third phosphor is from 580 nm to 670 nm, wherein a material of the first phosphor is different from that of the second phosphor, wherein the first phosphor is represented by at least one of the following formulas (3):

$(Ba, Mg, Ca, Sr)_{1-g}Si_2O_2N_2:Eu^{2+}{}_g$ (where, $0.01 \leq g \leq 0.30$) [formula 3]

wherein the second phosphor is represented by at least one of the following formulas (4) and (5):

$(Lu, Y, Gd)_{3-h}(Al, Ga)_5O_{12}:Ce^{3+}{}_h$ $0.01 \leq h \leq 0.50$. [formula 4]

$La_{3-i}Si_6N_{11}:Ce^{3+}{}_i$ $0.01 \leq i \leq 0.50$. [formula 5]

wherein the third phosphor is represented by at least one of the following formulas (6), (7) and (8):

$(Ca, Sr)_{1-j}AlSiN_3:Eu^{2+}{}_j$ $0.01 \leq j \leq 0.30$. [formula 6]

$Sr_{2-k}Si_5N_8:Eu^{2+}{}_k$ $0.01 \leq k \leq 0.30$. [formula 7]

$(Ba, Sr)_{2-l}Si_5N_8:Eu^{2+}{}_l$ $0.01 \leq l \leq 0.30$. [formula 8]

\* \* \* \* \*